United States Patent

Kudo et al.

[11] Patent Number: 5,986,744
[45] Date of Patent: Nov. 16, 1999

[54] PROJECTION OPTICAL SYSTEM, ILLUMINATION APPARATUS, AND EXPOSURE APPARATUS

[75] Inventors: Yuji Kudo, Kawasaki; Osamu Tanitsu, Funabashi, both of Japan

[73] Assignee: Nikon Corporation, Tokyo, Japan

[21] Appl. No.: 08/684,656

[22] Filed: Jul. 19, 1996

Related U.S. Application Data

[63] Continuation-in-part of application No. 08/603,001, Feb. 16, 1996, abandoned.

[30] Foreign Application Priority Data

Feb. 17, 1995 [JP] Japan .................................... 7-53579
Jul. 19, 1995 [JP] Japan .................................. 7-205306

[51] Int. Cl.⁶ .................................................. G03B 27/52
[52] U.S. Cl. ............................................. 355/55; 355/57
[58] Field of Search ............................. 355/53, 55, 57; 359/654, 668, 708, 710, 719, 744

[56] References Cited

U.S. PATENT DOCUMENTS

| | | | |
|---|---|---|---|
| 3,982,253 | 9/1976 | Goshima et al. ........................ 354/4 |
| 4,253,724 | 3/1981 | Minoura et al. ....................... 350/6.8 |
| 4,253,735 | 3/1981 | Kawamura et al. ................... 350/409 |
| 4,316,074 | 2/1982 | Daly ........................................ 219/121 |
| 4,318,594 | 3/1982 | Hanada .................................. 350/433 |
| 4,497,015 | 1/1985 | Konno et al. .......................... 362/268 |
| 4,530,574 | 7/1985 | Scifres et al. ......................... 350/420 |
| 4,619,508 | 10/1986 | Shibuya et al. ....................... 353/122 |
| 4,851,978 | 7/1989 | Ichihara ................................. 362/268 |
| 4,918,583 | 4/1990 | Kudo et al. ............................ 362/268 |
| 4,939,630 | 7/1990 | Kikuchi et al. ....................... 362/268 |
| 4,970,546 | 11/1990 | Suzuki et al. .......................... 355/53 |
| 5,117,255 | 5/1992 | Shiraishi et al. ...................... 355/53 |
| 5,121,160 | 6/1992 | Sano et al. ............................. 355/53 |
| 5,159,485 | 10/1992 | Nelson ................................... 359/291 |
| 5,184,223 | 2/1993 | Mihara .................................. 358/209 |
| 5,237,367 | 8/1993 | Kudo ....................................... 355/67 |
| 5,245,384 | 9/1993 | Mori ....................................... 355/67 |
| 5,307,207 | 4/1994 | Ichihara ................................ 359/622 |
| 5,331,466 | 7/1994 | Van Saarloos ....................... 359/723 |
| 5,467,335 | 11/1995 | Braat ..................................... 369/100 |
| 5,499,262 | 3/1996 | Nakata .................................. 372/108 |
| 5,636,003 | 6/1997 | Tanitsu et al. .......................... 355/67 |
| 5,828,496 | 10/1998 | Nishiwaki et al. .................. 359/626 |

FOREIGN PATENT DOCUMENTS 63-80243 4/1988 Japan .
6-196389 7/1994 Japan .
6-267894 9/1994 Japan .

*Primary Examiner*—Safet Metjahic
*Assistant Examiner*—John Chizmar
*Attorney, Agent, or Firm*—Foley & Lardner

[57] ABSTRACT

A projection optical system of the present invention comprises a shaping optical system which is disposed in an optical path between a first surface and a second surface on which an image of the first surface is formed and has a refractive power in only one of two directions which are perpendicular to an optical axis of the projection optical system and orthogonal to each other. This shaping optical system comprises a first lens group which has a refractive power in only one of the two directions which are orthogonal to each other and a second lens group which has a refractive power only in the direction in which the first lens group has the refractive power. Also, the shaping optical system relatively magnifies or reduces the image in one of the two directions orthogonal to each other within the second surface with respect to the image in the other direction and making image-forming positions of the images in the two directions orthogonal to each other within the second surface substantially coincide with each other.

61 Claims, 12 Drawing Sheets

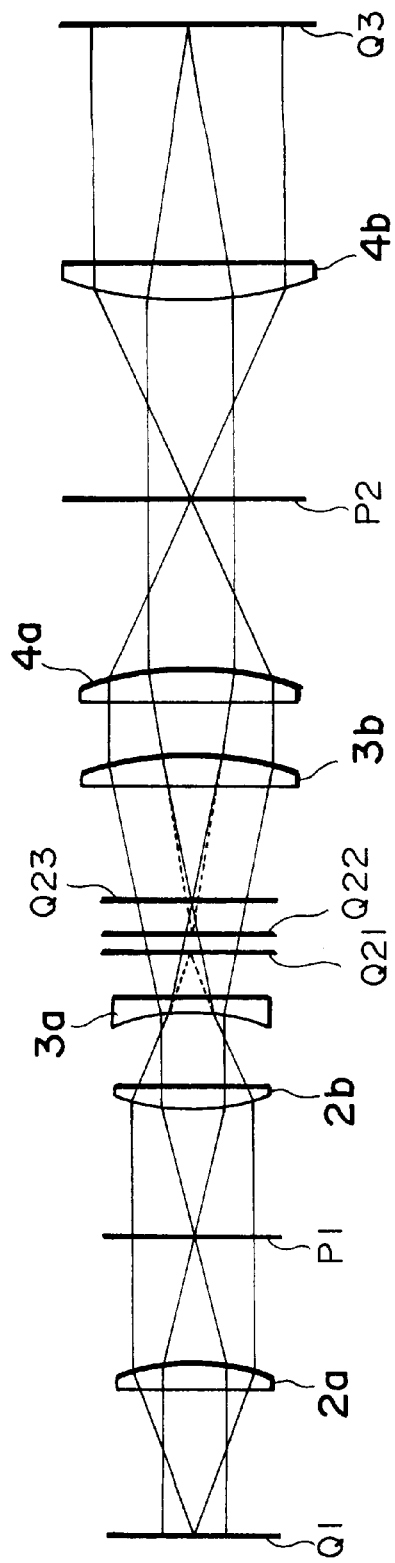
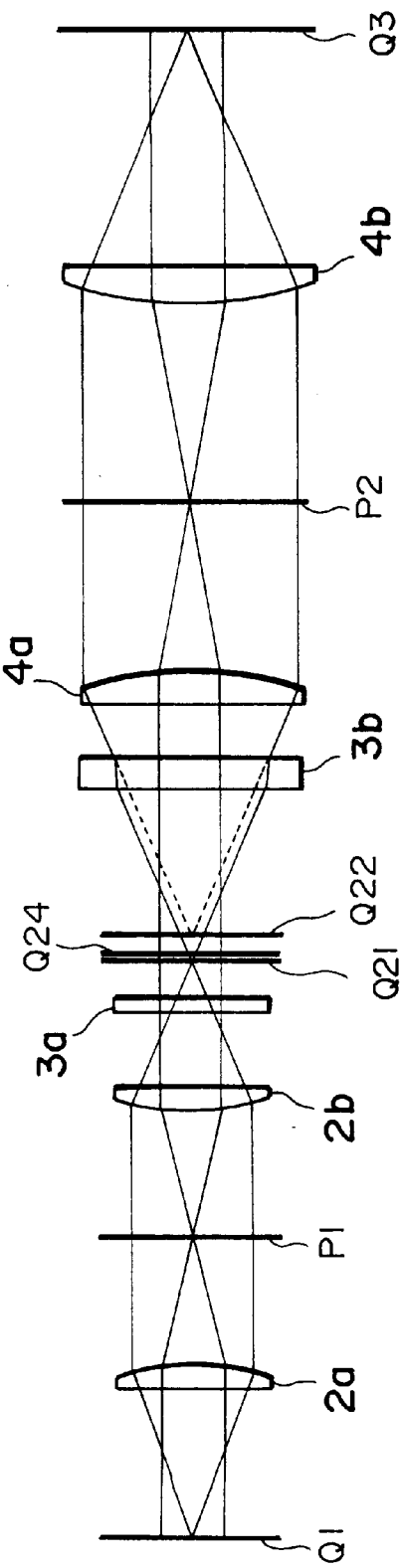

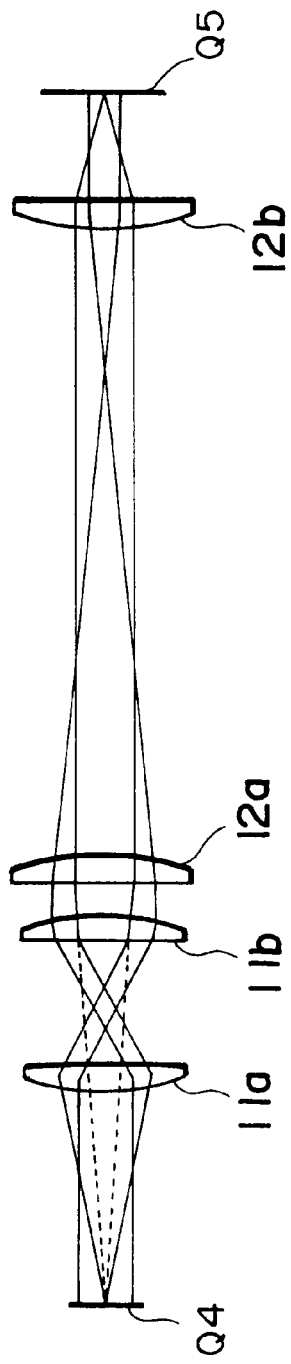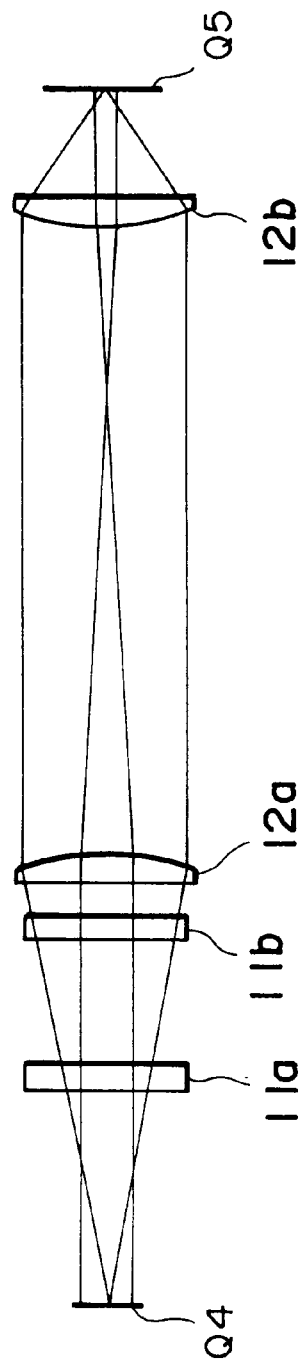

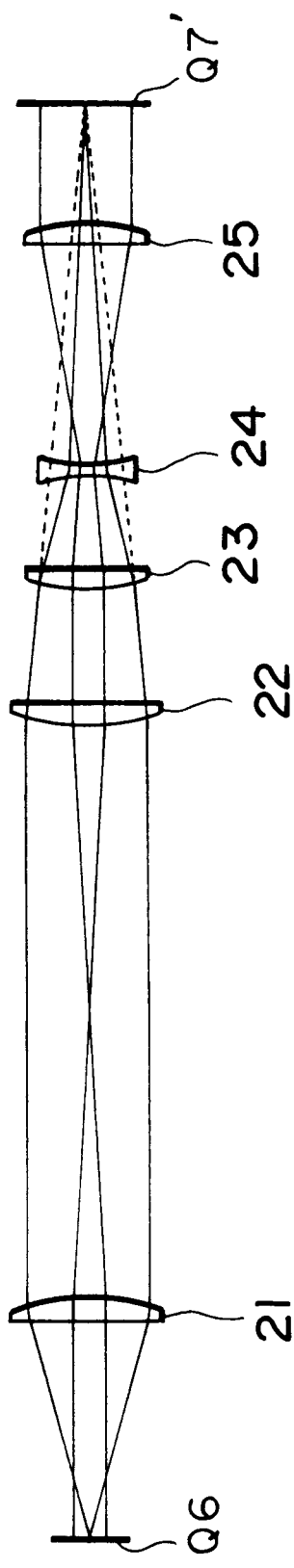
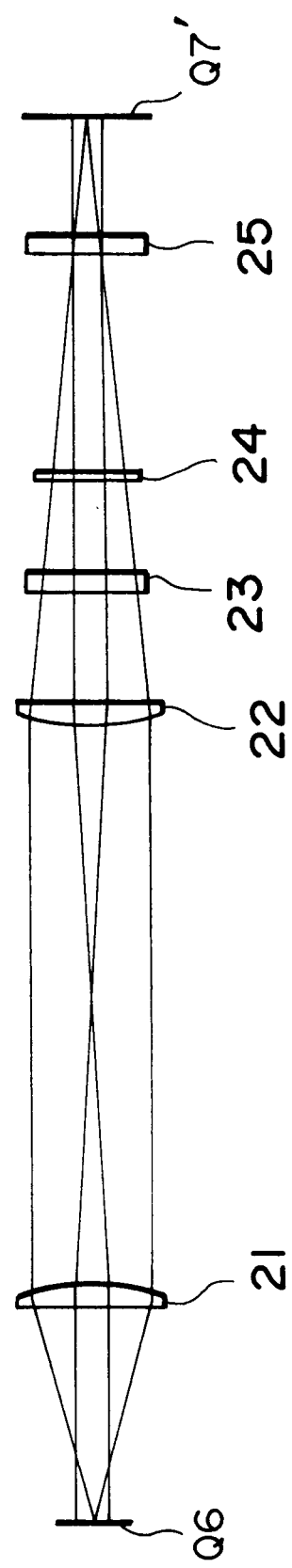
Fig. 5A
Fig. 5B

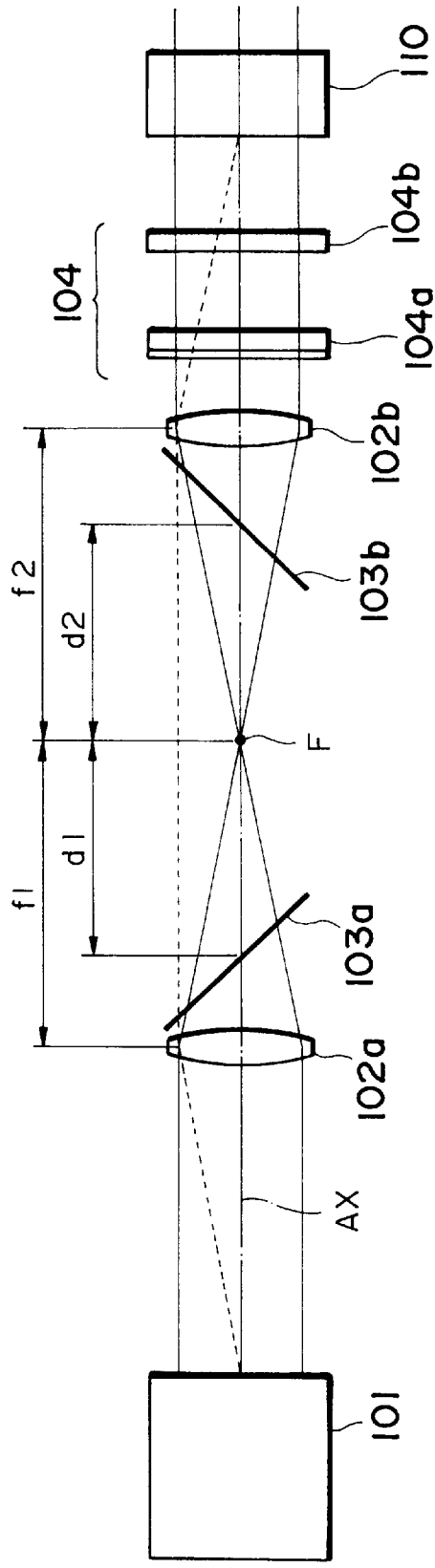
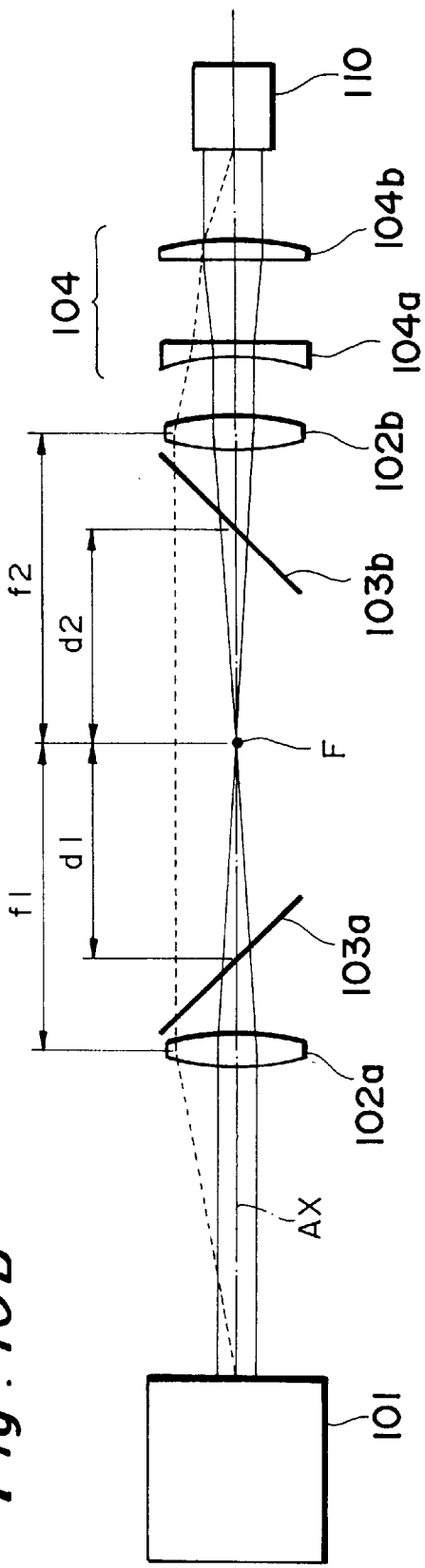
Fig. 10A.
Fig. 10B.

5,986,744

PROJECTION OPTICAL SYSTEM, ILLUMINATION APPARATUS, AND EXPOSURE APPARATUS

RELATED APPLICATIONS

This is a continuation-in-part application of application Ser. No.08/603,001 filed on Feb. 16, 1996, now abandoned.

BACKGROUND OF THE INVENTION

1. Field of the Invention

The present invention relates to a projection optical system, an illumination apparatus provided with this projection optical system as an illumination optical system, and an exposure apparatus loaded with this illumination apparatus. In particular, the present invention relates to an optical system used for projecting an image of an object surface onto an image surface while magnifying or reducing it in its longitudinal and lateral directions with magnifications different from each other, an illumination apparatus provided with this optical system, and an exposure apparatus loaded with this illumination apparatus.

2. Related Background Art

In conventional exposure apparatuses provided with projection optical systems, excimer laser and the like have been used as their light source. Since a parallel beam of light emitted from the excimer laser or the like has a rectangular cross-sectional shape, it forms images at positions in longitudinal and lateral directions different from each other by way of a projection optical system. Also, since angular shifts are likely to occur in the laser beam emitted from the light source, axial astigmatism may be generated.

Here, a projection exposure apparatus for manufacturing semiconductor devices, liquid display devices, and the like is a considerably large apparatus as a whole, thereby necessitating a large floor space for its installation. As the light source in the projection exposure apparatus, in general, mercury lamp, laser light source, or the like is used. In particular, a laser light source such as excimer laser light source is a light-emitting apparatus which is much larger than a light source such as mercury lamp.

Accordingly, in particular, in a projection exposure apparatus using a laser light source such as excimer laser light source, it is necessary for the laser light source to be disposed separately from the main body of the projection exposure apparatus. As a result, the use of the laser light source increases the floor space needed for the projection exposure apparatus as a whole.

Therefore, in order to position the laser light source apparatus and the main body of the projection exposure apparatus as close as possible to each other, the beam of light should be drawn around as short as possible in the optical path between the laser light source and the main body of the projection exposure apparatus. Alternatively, a deflecting member such as a reflective mirror should be appropriately disposed in the above-mentioned optical path so as to repeatedly bend the beam of light in a skillful manner.

In general, the projection exposure apparatus uses an optical integrator in order to uniformly illuminate a mask in a superposing manner. Accordingly, this optical integrator must be illuminated efficiently. When the laser light source apparatus and the main body of the projection exposure apparatus are disposed separately as mentioned above, however, the optical path between the laser light source and the optical integrator tends to become very long.

Consequently, due to the initial positional deviation of the excimer laser light source, which is a huge light-emitting apparatus, or the positional deviation of optical members caused by vibration during exposure, for example, the optical integrator may not be illuminated efficiently.

In a configuration in which a relay lens system is disposed between the laser light source and the optical integrator, various kinds of optical members such as cylinder beam expander should be disposed between the laser light source and the relay lens system or between the relay lens system and the optical integrator. Accordingly, a deflecting member such as a reflective mirror should be disposed in the optical path on the converging side of the relay lens system so as to bend the beam of light. In this case, depending on the position at which the deflecting member is disposed, the energy density of the incident laser beam becomes so large that the deflecting member may be damaged.

SUMMARY OF THE INVENTION

An object of the present invention is to provide a projection optical system which can project an image of an object surface onto an image surface while magnifying or reducing it in its longitudinal and lateral directions with magnifications independent from each other, an illumination apparatus provided with this projection optical system as an illumination optical system, and an exposure apparatus loaded with this illumination apparatus.

Another object of the present invention is to provide a projection optical system which can yield stable performances due to a deflecting member which is not damaged upon energy irradiation by a laser beam over a long period, an illumination apparatus provided with this projection optical system as an illumination optical system, and an exposure apparatus loaded with this illumination apparatus.

In order to attain the above-mentioned objects, the projection optical system of the present invention comprises a shaping optical system which is disposed in an optical path between a first surface and a second surface on which an image of the first surface is formed and has a refractive power in only one of two directions which are perpendicular to the optical axis of the projection optical system and orthogonal to each other; wherein this shaping optical system comprises a first lens group which has a refractive power in only one of the two directions which are orthogonal to each other and a second lens group which has a refractive power only in the direction in which the first lens group has the refractive power, thereby relatively magnifying or reducing the image in one of the two directions orthogonal to each other within the second surface with respect to the image in the other direction and making the imaging positions of the images in the two directions orthogonal to each other within the second surface substantially coincide with each other.

Here, preferably, the projection optical system of the present invention further comprises a secondary image-forming optical system which is disposed in the optical path between the first surface and the shaping optical system and converges a bundle of rays from the first surface so as to form an intermediate image, whereas the shaping optical system re-forms an image of the intermediate image on the second surface.

Also, preferably, the projection optical system of the present invention further comprises a secondary image-forming optical system which is disposed in the optical path between the shaping optical system and the second surface and re-forms, on the second surface, an image of the first surface formed by the shaping optical system.

Also, preferably, the projection optical system of the present invention further comprises a first secondary image-forming optical system which is disposed in the optical path between the first surface and the shaping optical system and converges a bundle of rays from the first surface so as to form an intermediate image and a second secondary image-forming optical system which is disposed in the optical path between the shaping optical system and the second surface and re-forms, on the second surface, an image of the intermediate image formed by the shaping optical system.

Also, preferably, in the projection optical system of the present invention, the shaping optical system is configured as an afocal optical system which converts a bundle of parallel rays incident thereon from the first surface into a bundle of parallel rays having a predetermined cross-sectional shape, while each of the first and second lens groups is constituted by a cylindrical lens.

Also, preferably, the projection optical system of the present invention, as a whole, is constituted as an afocal optical system which converts a bundle of parallel rays from the first surface into a bundle of parallel rays having a predetermined cross-sectional shape and introduces thus converted bundle of rays onto the second surface.

Also, preferably, the projection optical system of the present invention further comprises a relay optical system which is disposed in the optical path between the first surface and the shaping optical system and sets a third surface, which is positioned between the first surface and the shaping optical system, conjugate with the first surface; wherein the relay optical system comprises a first converging member which converges a bundle of rays from the first surface so as to form an intermediate image, a second converging member which converges a bundle of rays from the intermediate image and introduces thus converged bundle of rays onto the third surface, and at least one deflecting member which is disposed in at least one of the optical path between the first converging member and the intermediate image and the optical path between the intermediate image and the second converging member while being separated from the intermediate image along the optical axis of the relay optical system by a predetermined distance defined depending on change in energy density of the bundle of rays between the first and second converging members, deflects the bundle of rays from the first converging member, and introduces thus deflected bundle of rays onto the second converging member.

Desirably, in this case, based on energy density $E_0$ of the light emitted from the first converging member, tolerable energy density $E_d$ which is tolerable by at least one deflecting member during a predetermined period, and distance $D_1$ between the first converging member and the intermediate image along the optical axis, distance $D_0$ between the intermediate image and the at least one deflecting member is set so as to satisfy the conditional expression:

$$D_0 > D_1(E_0/E_d)^{1/2}$$

Also, desirably, at least one deflecting member is a reflective mirror.

Further, preferably, the projection optical system of the present invention further comprises a relay optical system which is disposed in the optical path between the shaping optical system and the second surface and sets a third surface, which is positioned between the shaping optical system and the second surface, conjugate with the second surface; wherein the relay optical system comprises a first converging member which converges a bundle of rays from the third surface so as to form an intermediate image, a second converging member which converges a bundle of rays from the intermediate image and introduces thus converged bundle of rays onto the second surface, and at least one deflecting member which is disposed in at least one of the optical path between the first converging member and the intermediate image and the optical path between the intermediate image and the second converging member while being separated from the intermediate image along the optical axis of the relay optical system by a predetermined distance defined depending on change in energy density of the bundle of rays between the first and second converging members, deflects the bundle of rays from the first converging member, and introduces thus deflected bundle of rays onto the second converging member.

Desirably, in this case, based on energy density $E_0$ of the light emitted from the first converging member, tolerable energy density $E_d$ which is tolerable by at least one deflecting member during a predetermined period, and distance $D_d$ between the first converging member and the intermediate image along the optical axis, distance $D_0$ between the intermediate image and the at least one deflecting member is set so as to satisfy the conditional expression:

$$D_0 > D_1(E_0/E_d)^{1/2}$$

Also, desirably, at least one deflecting member is a reflective mirror.

Next, in order to attain the above-mentioned objects, the illumination apparatus of the present invention comprises a light source which supplies a bundle of rays having a predetermined cross-sectional shape and a projection optical system which is disposed between an exit surface of the light source and a surface to be irradiated and converges the bundle of rays from the light source so as to form an image of the light source on the surface to be irradiated. This projection optical system comprises a shaping optical system which is disposed in an optical path between a first surface and a second surface on which an image of the first surface is formed and has a refractive power in only one of two directions which are perpendicular to the optical axis of the projection optical system and orthogonal to each other; wherein this shaping optical system comprises a first lens group which has a refractive power in only one of two directions which are orthogonal to each other and a second lens group which has a refractive power only in the direction in which the first lens group has the refractive power, thereby relatively magnifying or reducing the image in one of the two directions orthogonal to each other within the second surface with respect to the image in the other direction and making the imaging positions of the images in the two directions orthogonal to each other within the second surface substantially coincide with each other.

Here, preferably, in the illumination apparatus of the present invention, the projection optical system further comprises a secondary image-forming optical system which is disposed in the optical path between the first surface and the shaping optical system and converges a bundle of rays from the first surface so as to form an intermediate image, whereas the shaping optical system re-forms an image of the intermediate image on the second surface.

Also, preferably, in the illumination apparatus of the present invention, the projection optical system further comprises a secondary image-forming optical system which is disposed in the optical path between the shaping optical system and the second surface and re-forms, on the second surface, an image of the first surface formed by the shaping optical system.

Also, preferably, in the illumination apparatus of the present invention, the projection optical system further comprises a first secondary image-forming optical system which is disposed in the optical path between the first surface and the shaping optical system and converges the bundle of rays from the first surface so as to form an intermediate image and a second secondary image-forming optical system which is disposed in the optical path between the shaping optical system and the second surface and re-forms, on the second surface, an image of the intermediate image formed by the shaping optical system.

Also, preferably, in the illumination apparatus of the present invention, the shaping optical system is configured as an afocal optical system which converts a bundle of parallel rays incident thereon from the first surface into a bundle of parallel rays having a predetermined cross-sectional shape, while each of the first and second lens groups is constituted by a cylindrical lens.

Also, preferably, in the illumination apparatus of the present invention, the projection optical system, as a whole, is constituted as an afocal optical system which converts a bundle of parallel rays from the first surface into a bundle of parallel rays having a predetermined cross-sectional shape and introduces thus converted bundle of rays onto the second surface.

Also, preferably, in the illumination apparatus of the present invention, the projection optical system further comprises a first relay optical system which is disposed in the optical path between the first surface and the shaping optical system and sets a third surface, which is positioned between the first surface and the shaping optical system, conjugate with the first surface and a second relay optical system which is disposed between the second surface and the surface to be irradiated and sets the second surface and the surface to be irradiated conjugate with each other; wherein the first relay optical system comprises a first converging member which converges a bundle of rays from the first surface so as to form an intermediate image, a second converging member which converges a bundle of rays from the intermediate image and introduces thus converged bundle of rays onto the third surface, and at least one deflecting member which is disposed in at least one of the optical path between the first converging member and the intermediate image and the optical path between the intermediate image and the second converging member while being separated from the intermediate image along the optical axis of the relay optical systems by a predetermined distance defined depending on change in energy density of the bundle of rays between the first and second converging members, deflects the bundle of rays from the first converging member, and introduces thus deflected bundle of rays onto the second converging member.

Desirably, in this case, based on energy density $E_0$ of the light emitted from the first converging member, tolerable energy density $E_d$ which is tolerable by at least one deflecting member during a predetermined period, and distance $D_1$ between the first converging member and the intermediate image along the optical axis, distance $D_0$ between the intermediate image and the at least one deflecting member is set so as to satisfy the conditional expression:

$$D_0 > D_1 (E_0/E_d)^{1/2}$$

Also, desirably, the second relay optical system comprises a multiple light source forming system which forms a plurality of light source images based on a bundle of rays from the shaping optical system and a condenser optical system which converges a bundle of rays from each of the plurality of light source images so as to illuminate, in a superposing manner, the surface to be irradiated, whereas the first surface coincides with the exit surface of the light source.

Further, desirably, the light source is an excimer laser light source, whereas at least one deflecting member is a reflective mirror. Here, more desirably, the projection optical system further comprises a ray bundle magnifying system which is disposed in the optical path between the excimer laser light source and the first relay optical system and magnifies a bundle of parallel rays from the excimer laser light source.

Further, preferably, in the illumination apparatus of the present invention, the projection optical system further comprises a first relay optical system which is disposed in the optical path between the shaping optical system and the second surface and sets a third surface, which is positioned between the shaping optical system and the second surface, conjugate with the second surface and a second relay optical system which is disposed between the second surface and the surface to be irradiated and sets the second surface and the surface to be irradiated conjugate with each other; wherein the first relay optical system comprises a first converging member which converges a bundle of rays from the third surface so as to form an intermediate image, a second converging member which converges a bundle of rays from the intermediate image and introduces thus converged bundle of rays onto the second surface, and at least one deflecting member which is disposed in at least one of the optical path between the first converging member and the intermediate image and the optical path between the intermediate image and the second converging member while being separated from the intermediate image along the optical axis of the relay optical systems by a predetermined distance defined depending on change in energy density of the bundle of rays between the first and second converging members, deflects the bundle of rays from the first converging member, and introduces thus deflected bundle of rays onto the second converging member.

Desirably, in this case, based on energy density $E_0$ of the light emitted from the first converging member, tolerable energy density $E_d$ which is tolerable by at least one deflecting member during a predetermined period, and distance $D_1$ between the first converging member and the intermediate image along the optical axis, distance $D_0$ between the intermediate image and the at least one deflecting member is set so as to satisfy the conditional expression:

$$D_0 > D_1 (E_0/E_d)^{1/2}$$

Also, desirably, the second relay optical system comprises a multiple light source forming system which forms a plurality of light source images based on a bundle of rays from the shaping optical system and a condenser optical system which converges a bundle of rays from each of the plurality of light source images so as to illuminate, in a superposing manner, the surface to be irradiated, whereas the first surface coincides with the exit surface of the light source.

Further, more preferably, the light source is an excimer laser light source, whereas at least one deflecting member is a reflective mirror. Here, more desirably, the projection optical system further comprises a ray bundle magnifying system which is disposed in the optical path between the excimer laser light source and the first relay optical system and magnifies a bundle of parallel rays from the excimer laser light source.

Next, in order to attain the above-mentioned objects, the exposure apparatus of the present invention comprises an illumination apparatus which irradiates, with illumination light, a pattern formed on a projection original and a projection exposure optical system which projects, onto a photosensitive substrate, an image of the pattern transmitted through the projection original as exposure light; wherein the illumination apparatus comprises a light source which supplies a bundle of rays having a predetermined cross-sectional shape and a projection optical system which is disposed between an exit surface of the light source and a surface to be irradiated and converges the bundle of rays from the light source so as to form an image of the light source on the surface to be irradiated. This projection optical system comprises a shaping optical system which is disposed in an optical path between a first surface and a second surface on which an image of the first surface is formed and has a refractive power in only one of two directions which are perpendicular to the optical axis of the projection optical system and orthogonal to each other, a multiple light source forming system which forms a plurality of light source images based on a bundle of rays from the shaping optical system, and a condenser optical system which converges a bundle of rays from each of the plurality of light source images so as to illuminate, in a superposing manner, the surface to be irradiated; wherein the shaping optical system comprises a first lens group which has a refractive power in only one of two directions which are orthogonal to each other and a second lens group which has a refractive power only in the direction in which the first lens group has the refractive power, thereby relatively magnifying or reducing the image in one of the two directions orthogonal to each other within the second surface with respect to the image in the other direction and making the imaging positions of the images in the two directions orthogonal to each other within the second surface substantially coincide with each other.

Here, preferably, in the exposure apparatus of the present invention, the projection optical system further comprises a secondary image-forming optical system which is disposed in the optical path between the first surface and the shaping optical system and converges a bundle of rays from the first surface so as to form an intermediate image, whereas the shaping optical system re-forms an image of the intermediate image on the second surface.

Also, preferably, in the exposure apparatus of the present invention, the projection optical system further comprises a secondary image-forming optical system which is disposed in the optical path between the shaping optical system and the second surface and re-forms, on the second surface, an image of the first surface formed by the shaping optical system.

Also, preferably, in the exposure apparatus of the present invention, the projection optical system further comprises a first secondary image-forming optical system which is disposed in the optical path between the first surface and the shaping optical system and converges a bundle of rays from the first surface so as to form an intermediate image and a second secondary image-forming optical system which is disposed in the optical path between the shaping optical system and the second surface and re-forms, on the second surface, the image of the intermediate image formed by the shaping optical system.

Also, preferably, in the exposure apparatus of the present invention, the shaping optical system is configured as an afocal optical system which converts a bundle of parallel rays incident thereon from the first surface into a bundle of parallel rays having a predetermined cross-sectional shape, while each of the first and second lens groups is constituted by a cylindrical lens.

Also, preferably, in the exposure apparatus of the present invention, the projection optical system, as a whole, is constituted as an afocal optical system which converts a bundle of parallel rays from the first surface into a bundle of parallel rays having a predetermined cross-sectional shape and introduces thus converted bundle of rays onto the second surface.

Also, preferably, in the exposure apparatus of the present invention, the projection optical system further comprises a relay optical system which is disposed in the optical path between the first surface and the shaping optical system and sets a third surface, which is positioned between the first surface and the shaping optical system, conjugate with the first surface; wherein the relay optical system comprises a first converging member which converges a bundle of rays from the first surface so as to form an intermediate image, a second converging member which converges a bundle of rays from the intermediate image and introduces thus converged bundle of rays onto the third surface, and at least one deflecting member which is disposed in at least one of the optical path between the first converging member and the intermediate image and the optical path between the intermediate image and the second converging member while being separated from the intermediate image along the optical axis of the relay optical system by a predetermined distance defined depending on change in energy density of the bundle of rays between the first and second converging members, deflects the bundle of rays from the first converging member, and introduces thus deflected bundle of rays onto the second converging member.

Desirably, in this case, based on energy density $E_0$ of the light emitted from the first converging member, tolerable energy density $E_d$ which is tolerable by at least one deflecting member during a predetermined period, and distance $D_1$ between the first converging member and the intermediate image along the optical axis, distance $D_0$ between the intermediate image and the at least one deflecting member is set so as to satisfy the conditional expression:

$$D_0 > D_1 (E_0/E_d)_{1/2}$$

Preferably, in the exposure apparatus of the present invention, the projection optical system further comprises a relay optical system which is disposed in the optical path between the shaping optical system and the second surface and sets a third surface, which is positioned between the shaping optical system and the second surface, conjugate with the second surface; wherein the relay optical system comprises a first converging member which converges a bundle of rays from the third surface so as to form an intermediate image, a second converging member which converges a bundle of rays from the intermediate image and introduces thus converged bundle of rays onto the second surface, and at least one deflecting member which is disposed in at least one of the optical path between the first converging member and the intermediate image and the optical path between the intermediate image and the second converging member while being separated from the intermediate image along the optical axis of the relay optical system by a predetermined distance defined depending on change in energy density of the bundle of rays between the first and second converging members, deflects the bundle of rays from the first converging member, and introduces thus deflected bundle of rays onto the second converging member.

Desirably, in this case, based on energy density $E_0$ of the light emitted from the first converging member, tolerable energy density $E_d$ which is tolerable by at least one deflecting member during a predetermined period, and distance $D_1$ between the first converging member and the intermediate image along the optical axis, distance $D_0$ between the intermediate image and the at least one deflecting member is set so as to satisfy the conditional expression:

$$D_0 > D_1 (E_0/E_d)$$

Further, preferably, in the exposure apparatus of the present invention, the multiple light source forming system and the condenser optical system are configured as a relay optical system which sets the second surface and the projection original conjugate with each other, whereas the first surface coincides with the exit surface of the light source.

Desirably, in this case, the light source is an excimer laser light source, whereas at least one deflecting member is a reflective mirror. Here, more desirably, the projection optical system further comprises a ray bundle magnifying system which is disposed in the optical path between the excimer laser light source and the relay optical system and magnifies a bundle of parallel rays from the excimer laser light source.

In the projection optical system of the present invention, the shaping optical system such as a cylindrical optical system composed of two lens groups having their refractive power only in one of two directions orthogonal to each other at an image surface, namely, longitudinal and lateral directions, is provided. Also, the shaping optical system makes the image-forming positions in the two orthogonal directions at the image surface coincide with each other.

Thus, in the present invention, by using only one set of the cylindrical optical system, an image of the object surface can be projected while independently magnifying or reducing it in longitudinal and lateral directions. Also, the object surface and the image surface can be maintained conjugate with each other in both longitudinal and lateral directions, thereby preventing axial astigmatism from occurring.

More specifically, it is preferable for the projection optical system to comprise a afocal system composed of, for example, two spherical lenses and a cylindrical afocal system composed of, for example, two cylindrical lenses whose generating lines each extend in the longitudinal direction as the shaping optical system. In this manner, a parallel bundle of rays from the object surface can be magnified or reduced in the longitudinal direction by the afocal system alone, while a parallel bundle of rays from the object surface can be magnified or reduced in the lateral direction by the afocal system and the cylindrical afocal system.

Also, it is preferable for the afocal system and the cylindrical afocal system to be relatively positioned with respect to each other in an optical axis such that the image-forming positions of the light components from the object surface passing through the afocal and cylindrical afocal systems in the longitudinal and lateral directions coincide with each other. In this manner, the object surface and the image surface can be maintained conjugate with each other in both longitudinal and lateral directions.

Further, in the exposure apparatus of the present invention provided with the projection optical system of the present invention, while the light source supplies a parallel bundle of rays to the object surface of the projection optical system, a light-entering surface of the multiple light source forming system of, for example, a fly-eye lens is disposed at the image surface of the projection optical system.

Accordingly, while only one set of a cylindrical optical system is used, the parallel bundle of rays from the light source can be shaped so as to correspond to the cross-sectional shape of the fly-eye lens with its loss in light quantity being minimized. Further, since no axial astigmatism is generated at the light-entering surface of the fly-eye lens, the light source has a greater tolerance for angular shift. Also, since all the generating lines of the cylindrical lens are in the same direction, the direction of the generating lines can be easily adjusted.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 1A and 1B are schematic views showing a configuration of a projection optical system in accordance with Embodiment 1 of the present invention including a Galilean cylindrical afocal system;

FIGS. 3A and 3B are schematic views showing a configuration of a projection optical system in accordance with Embodiment 2 of the present invention including a Keplerian cylindrical afocal system;

FIGS. 5A and 5B are schematic views showing a configuration of a projection optical system in accordance with Embodiment 3 of the present invention including a Galilean cylindrical afocal zoom system;

FIGS. 10A and 10B are developments of optical path respectively showing configurations of the illumination apparatus of FIG. 9 along two orthogonal surfaces including the optical axis;

DESCRIPTION OF THE PREFERRED EMBODIMENTS

Figure 2A:
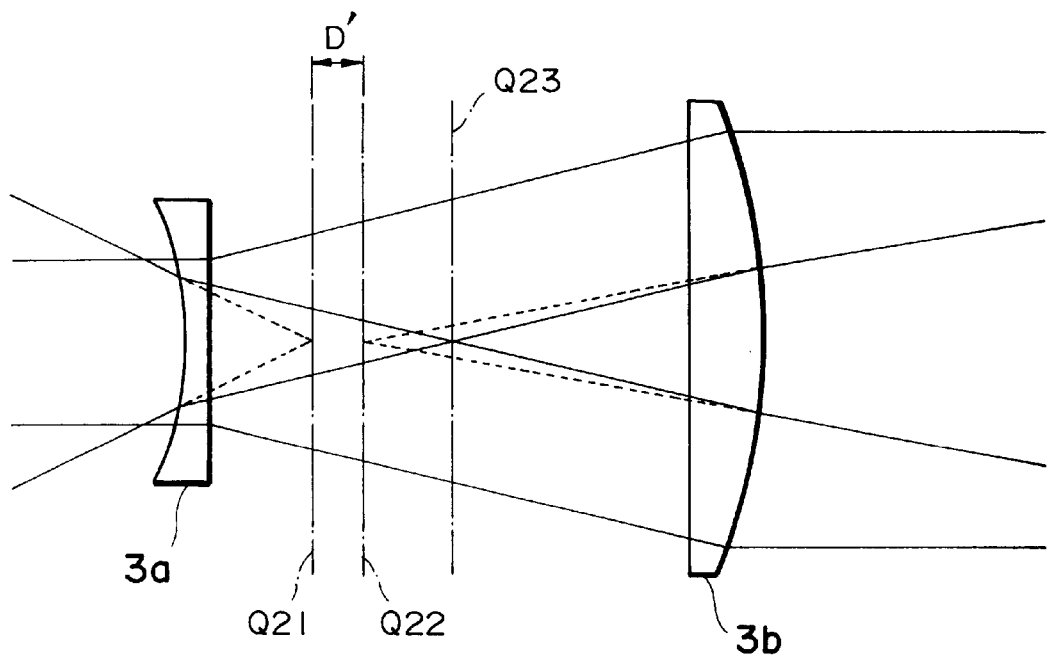
FIGS. 2A and 2B are enlarged views respectively showing optical paths of the cylindrical afocal system in the projection optical system shown in FIGS. 1A and 1B.

In the following, configurations and operations of various embodiments in accordance with the projection optical system, illumination apparatus, and exposure apparatus of the present invention will be explained in detail with reference to FIGS. 1A to 12. Here, in the explanation of the drawings, elements identical to each other will be referred to with marks identical to each other without their overlapping explanations being repeated. Also, the ratios of sizes in the drawings do not always correspond to those explained.

Embodiment 1

FIGS. 1A and 1B are schematic views showing the configuration of the projection optical system in accordance with the present embodiment. FIGS. 1A and 1B respectively show the same optical system in two surface directions which are orthogonal to each other including an optical axis, namely, in longitudinal and lateral directions. Here, the longitudinal and lateral directions are nothing else than two directions orthogonal to each other at the image surface of the projection optical system.

Figure 2B:
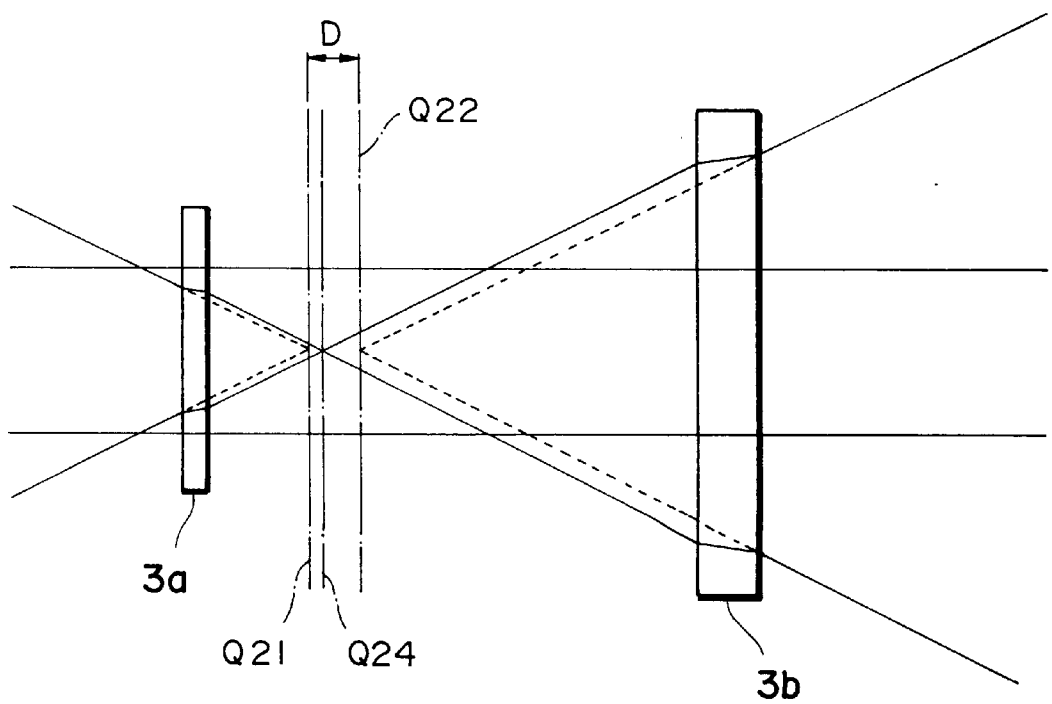

Also, FIGS. 2A and 2B, which respectively correspond to FIGS. 1A and 1B, are enlarged views showing the optical paths of the cylindrical afocal system in the projection optical system shown in FIGS. 1A and 1B.

As shown in FIG. 1A, when the optical system is viewed in the longitudinal direction, two cylindrical lenses 3a and 3b, whose generating lines each extend in the lateral direction, as a pair, form a cylindrical optical system or, more specifically, a set of a Galilean cylindrical afocal system as a shaping optical system. Here, the cylindrical lenses 3a and 3b respectively have a positive refractive power and a negative refractive power in the longitudinal direction.

Also, between the cylindrical afocal system (3a, 3b) and its object surface Q1, two spherical lenses 2a and 2b, as a pair, form a first Keplerian afocal system. On the other hand, between the cylindrical system (3a, 3b) and its image surface Q3, two spherical lenses 4a and 4b, as a pair, form a second Keplerian afocal system.

Accordingly, in the longitudinal direction, a parallel bundle of rays emitted from the object surface Q1 is magnified or reduced while passing through the first Keplerian afocal system (2a, 2b) and then magnified by the Galilean cylindrical afocal system (3a, 3b). Thereafter, it is magnified or reduced while passing through the second Keplerian afocal system (4a, 4b) and then reaches the image surface Q3 as a parallel bundle of rays which is wider than that emitted from the object surface Q1. Namely, in the longitudinal direction, the magnification or reduction of the parallel bundle of rays emitted from the object surface Q1 depends on the first Keplerian afocal system (2a, 2b), the Galilean cylindrical afocal system (3a, 3b), and the second Keplerian afocal system (4a, 4b).

In the lateral direction, on the other hand, the Galilean cylindrical afocal system (3a, 3b) has no power (refractive power). Accordingly, the Galilean cylindrical afocal system (3a, 3b) does not magnify the bundle of rays. Namely, in the lateral direction, the magnification or reduction of the bundle of rays emitted from the object surface Q1 only depends on the first Keplerian afocal system (2a, 2b) and the second Keplerian afocal system (4a, 4b).

Next, the conjugate relationship with the object surface Q1 is taken into consideration. In the lateral direction, as shown in FIGS. 1B and 2B, light emitted from the central point of the object surface Q1 is converged by the first Keplerian afocal system (2a, 2b), which is a secondary image-forming optical system, so as to form an image on a surface Q21. The light which has been converged so as to form an image on the surface Q21 is refracted by the Galilean cylindrical afocal system (3a, 3b). However, since the Galilean cylindrical afocal system (3a, 3b) has no power in the lateral direction, it functions as a simple plane plate.

Namely, the light which has passed through the Galilean cylindrical afocal system (3a, 3b) forms a virtual image of the surface Q1 on a surface Q22 which is slightly shifted from the surface Q21 toward the image surface Q3 according to the sum of axial thickness values of the cylindrical lenses 3a and 3b. At this time, a real image of the surface Q1 is formed at the position of a surface Q24 between the surfaces Q21 and Q22. Then, the second Keplerian afocal system (4a, 4b), which is a secondary image-forming optical system, relays the virtual image formed on the surface Q22 so as to form an image on the image surface Q3.

In the longitudinal direction, on the other hand, as shown in FIGS. 1A and 2A, the light converged by the first Keplerian afocal system (2a, 2b) so as to form an image on the surface Q21 is transmitted through the Galilean cylindrical afocal system (3a, 3b) so as to form a virtual image of the surface Q1 on the surface Q22. At this time, at the position of a surface Q23 which is shifted from the surface Q22 toward the object surface Q3, a real image of the surface Q1 is formed. Then, the second Keplerian afocal system (4a, 4b) relays the virtual image formed on the surface Q22 so as to form an image on the image surface Q3.

In the projection optical system of the present embodiment, the position of the surface Q22 in the longitudinal direction shown in FIG. 2A coincides with that in the lateral direction shown in FIG. 2B. The conditions under which the positions of the surface Q22 in the longitudinal and lateral directions coincide with each other will be explained later.

Thus, in the projection optical system of the embodiment, the virtual image of the object surface Q1 formed on the conjugate surface Q21 by the first Keplerian afocal system (2a, 2b) is then formed on the surface Q22 by the Galilean cylindrical afocal system (3a, 3b). However, since the positions of the surface Q22 in the longitudinal and lateral directions respectively with and without a power of the Galilean cylindrical afocal system (3a, 3b) coincide with each other, no axial astigmatism occurs due to the Galilean cylindrical afocal system (3a, 3b). Then, the virtual image formed on the surface Q22 is relayed by the second Keplerian afocal system (4a, 4b) and forms an image on the image surface Q3 with magnifications in longitudinal and lateral directions different from each other according to the magnification of the Galilean cylindrical afocal system (3a, 3b).

In the following, the conditions under which the positions of the surface Q22 in the longitudinal and lateral directions coincide with each other will be explained with reference to FIGS. 2A and 2B.

As shown in FIG. 2B, in the lateral direction, the cylindrical afocal system (3a, 3b) functions as a simple plane parallel plate. In this case, distance D between the conjugate surface Q21 of the object surface Q1 according to the first Keplerian afocal system (2a, 2b) and the conjugate surface Q22 of the surface Q21 according to the cylindrical afocal system (3a, 3b) is expressed by the following equation (1):

$$D = (n1-1)t1/n1 + (n2-1)t2/n2 \qquad (1)$$

wherein:

n1: refractive index of the cylindrical lens 3a
n1: refractive index of the cylindrical lens 3b
t1: axial thickness of the cylindrical lens 3a
t2: axial thickness of the cylindrical lens 3b As indicated by equation (1), the distance D between the surfaces Q21 and Q22 is defined by the refractive index and axial thickness values of the two cylindrical lenses 3a and 3balone without depending on the positions of the cylindrical lenses 3a and 3bon the optical axis. On the other hand, since the position of the surface Q21 on the optical axis depends solely on the first Keplerian afocal system (2a, 2b) and not on the cylindrical afocal system (3a, 3b), its positions in the longitudinal and lateral directions coincide with each other.

Accordingly, in order for the positions of the virtual image surface Q22 in the longitudinal and lateral directions to coincide with each other, it is sufficient for the two cylindrical lenses 3a and 3bto be disposed such that distance D' between the conjugate surface Q21 of the object surface Q1 and the virtual image surface Q22 of the surface Q21 according to the cylindrical afocal system (3a, 3b) in the longitudinal direction coincides with the distance D defined by the above-mentioned equation (1).

Here, in the longitudinal direction shown in FIG. 2A, principal point distance d of the two cylindrical lenses 3a and 3b [distance between the rear principal plane (on the image surface side) of the cylindrical lens 3a and the front principal plane (on the object surface side) of the cylindrical lens 3b] is expressed by the following equation (2):

$$d = f1 + f2 \quad (2)$$

wherein:

f1: focal length of the cylindrical lens 3a
f2: focal length of the cylindrical lens 3b Also, assuming that the distance between the front principal plane of the cylindrical lens 3a and the surface Q21 is x1 and the distance between the rear principal plane of the cylindrical lens 3a and the surface Q23 is x1d, based on Newton's formula, a relationship expressed by the following equation (3) is established:

$$1/f1 = -(1/x1) + (1/x1d) \quad (3)$$

In equation (3), the signs of the distances x1 and x1d are defined as positive in the direction from the object surface to the image surface along the optical axis. Also, in the following explanation, signs concerning other distance values are similarly defined as positive in the direction from the object surface to the image surface along the optical axis.

Further, assuming that the distance between the front principal plane of the cylindrical lens 3band the surface Q23 is x2 and the distance between the rear principal plane of the cylindrical lens 3band the surface Q22 is x2d, based on Newton's formula, a relationship expressed by the following equation (4) is established:

$$1/f2 = -(1/x2) + (1/x2d) \quad (4)$$

Also, among the distance x1d, the distance x2, and the principal point distance d, a relationship expressed by the following equation (5) is established:

$$d = x1d - x2 \quad (5)$$

Assuming that the distance between the front and rear principal planes of the cylindrical lens 3a is p1 and the distance between the front and rear principal planes of the cylindrical lens 3bis p2, in order for the distance D' between the surfaces Q21 and Q22 in the longitudinal direction and the distance D between the surfaces Q21 and Q22 in the lateral direction to coincide with each other, the following equation (6) should be satisfied:

$$d + p1 + p2 = x1 - x2d + D \quad (6)$$

From the above-mentioned equations (2) to (6), the distance x1 is obtained by the following equation (7):

$$x1 = f1\{-D \cdot f1 + (f1+f2)^2 + f1(p1+p2)\} / \{(f1-f2)(f1+f2)\} \quad (7)$$

When the cylindrical afocal system (3a, 3b) is disposed so as to satisfy the above equation (7), the positions of the image surface Q22 according to the first Keplerian afocal system (2a, 2b) and cylindrical afocal system (3a, 3b) with respect to light from the object surface Q1 in the longitudinal and lateral directions coincide with each other and, accordingly, the positions of the image surface Q3 of the whole projection optical system in the longitudinal and lateral directions coincide with each other.

Namely, by the projection optical system comprising one set of the Galilean cylindrical afocal system (3a, 3b) and two sets of the Keplerian afocal systems (2a, 2b; 4a, 4b), an image of the object surface Q1 can be projected onto the image surface Q3 while being magnified or reduced with its longitudinal and lateral magnifications independent from each other, whereas the object surface Q1 and the image surface Q3 can be maintained conjugate with each other in both longitudinal and lateral directions, thereby preventing axial astigmatism from occurring.

In the following, with a specific example of numerical values in the present embodiment, the position of the cylindrical afocal system (3a, 3b) which satisfies the conditions under which no axial astigmatism occurs will be determined.

The items for the cylindrical afocal system (3a, 3b) in this example are shown in the following Table 1. In Table 1, r1, r2, t, and n respectively indicate radius of curvature of the surface facing the object surface, radius of curvature of the surface facing the image surface, axial thickness, and refractive index.

TABLE 1

|  | r1 | r2 | t | n |
|---|---|---|---|---|
| Lens 3a | −60 |  | 1.6 | 1.6 |
| Lens 3b |  | −120 | 4.8 | 1.6 |

Based on the items shown in Table 1, focal length f1, focal length f2, principal point distance d, and distances p1 and p2 take values as follows:

f1=−100
f2=200
d=100
p1=0.6
p2=1.8

As mentioned above, in the lateral direction shown in FIG. 2B, the cylindrical afocal system (3a, 3b) functions as a simple plane parallel plate since it has no power. Accordingly, from equation (1), the distance between the surfaces Q21 and Q22 in the lateral direction is determined as D=2.4.

On the other hand, when the above-mentioned values of f1, f2, D, p1, and p2 are input into equation (7), distance x1=+33.3333 can be obtained.

Accordingly, when the first Keplerian afocal system (2a, 2b) and the cylindrical afocal system (3a, 3b) are relatively positioned with respect to each other such that the conjugate surface Q21 of the object surface Q1 is placed at the position which is distanced by 33.3333 from the front principal plane of the cylindrical lens 3a toward the image surface, an image (virtual image in this embodiment) of the object surface Q1 is formed at the same position (position of the surface Q22) on the optical axis.

When the image formed on this surface Q22 is projected onto the image surface Q3 by the second Keplerian afocal system (4a, 4b), an image of the object surface Q1 is finally formed with its magnifications in longitudinal and lateral directions different from each other. Further, since the object surface Q1 and the image surface Q3 are maintained conjugate with each other in both longitudinal and lateral directions, no axial astigmatism occurs.

The foregoing equations (1) to (7) can apply not only to the Galilean cylindrical afocal system but also to a Keplerian cylindrical afocal system as they are.

Embodiment 2

FIGS. 3A and 3B are schematic views showing the configuration of the projection optical system in accordance with the present embodiment including a Keplerian cylindrical afocal system. FIGS. 3A and 3B respectively show the same optical system in two surface directions which are orthogonal to each other including an optical axis, namely, in longitudinal and lateral directions.

Figure 4:
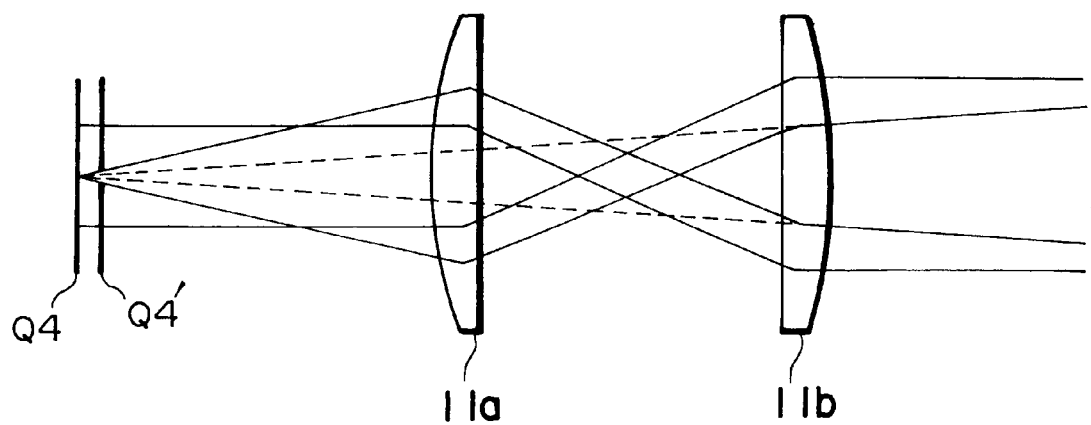
FIG. 4 is an enlarged view showing an optical path of the Keplerian cylindrical afocal system in the projection optical system shown in FIGS. 3A and 3B.

Also, FIG. 4, which corresponds to FIG. 3A, is an enlarged view showing the optical path of the Keplerian cylindrical afocal system in the projection optical system of FIG. 3A.

As shown in FIG. 3A, when the optical system is viewed in the longitudinal direction, two cylindrical lenses 11a and 11b, whose generating lines each extend in the lateral direction, as a pair, form a set of a Keplerian cylindrical afocal system as a shaping optical system. Both of the cylindrical lenses 11a and 11b have a positive refractive power in the longitudinal direction.

Also, between the cylindrical afocal system (11a, 11b) and its image surface Q5, two spherical lenses 12a and 12b, as a pair, form a Keplerian afocal system.

Accordingly, in the longitudinal direction, a parallel bundle of rays emitted from an object surface Q4 is magnified or reduced by the Keplerian cylindrical afocal system (11a, 11b) and then magnified or reduced while passing through the Keplerian afocal system (12a, 12b) so as to reach the image surface Q5. Namely, in the longitudinal direction, the magnification or reduction of the parallel bundle of rays emitted from the object surface Q4 depends on the Keplerian cylindrical afocal system (11a, 11b) and the Keplerian afocal system (12a, 12b).

In the lateral direction, on the other hand, as shown in FIG. 3B, the Keplerian cylindrical afocal system (11a, 11b) has no power. Accordingly, the Keplerian cylindrical afocal system (11a, 11b) neither magnifies nor reduces the bundle of rays. Namely, in the lateral direction, the magnification or reduction of the parallel bundle of rays emitted from the object surface Q4 solely depends on the Keplerian afocal system (12a, 12b).

In the following, with a specific example of numerical values in the present embodiment, the position of the cylindrical afocal system (11a, 11b) which satisfies the conditions under which no axial astigmatism occurs will be determined on the basis of the foregoing equations (1) to (7).

The items for the cylindrical afocal system (11a, 11b) in this example are shown in the following Table 2. In Table 2, r1, r2, t, and n respectively indicate radius of curvature of the surface facing the object surface, radius of curvature of the surface facing the image surface, axial thickness, and refractive index.

TABLE 2

|  | r1 | r2 | t | n |
|---|---|---|---|---|
| Lens 11a | 60 |  | 1.6 | +1.6 |
| Lens 11b |  | −120 | 4.8 | 1.6 |

Based on the items shown in Table 2, focal length f1, focal length f2, principal point distance d, and distances p1 and p2 take values as follows:

f1=100
f2=200
d=300
p1=0.6
p2=1.8

As mentioned above, in the lateral direction shown in FIG. 3B, the cylindrical afocal system (11a, 11b) functions as a simple plane parallel plate since it has no power. Accordingly, from equation (1), D=2.4 is obtained.

On the other hand, when the above-mentioned values of f1, f2, D, p1, and p2 are input into equation (7), distance x1=−300.0 can be obtained.

Accordingly, it can be seen that it is sufficient for the system to be configured such that the object surface or a conjugate surface of the object surface is positioned at the surface Q4 which is distanced by 300.0 from the front principal plane of the cylindrical lens 11a toward the object surface. In the present embodiment, the surface Q4 where the object surface or a conjugate surface of the object surface should be placed is disposed on the left side of the cylindrical afocal system (11a, 11b) in the drawing. Accordingly, without a relay lens system such as the first Keplerian afocal system (2a, 2b) in Embodiment 1 for forming a conjugate surface of the object surface, the object surface can be directly disposed at the surface Q4.

Thus, the cylindrical afocal system (11a, 11b) forms a conjugate surface Q4' of the object surface Q4 at a position which is distanced from the surface Q4 by +2.4. Then, the image formed at the conjugate surface Q4' is relayed by the Keplerian afocal system (12a, 12b) so as to be projected onto the image surface Q5 whose positions in longitudinal and lateral directions are the same.

Accordingly, by the projection optical system comprising one set of the Keplerian cylindrical system (11a, 11b) and one set of the Keplerian afocal system (12a, 12b), an image of the object surface Q4 can be projected onto the image surface Q5 while being magnified or reduced with its longitudinal and lateral magnifications independent from each other, whereas the object surface Q4 and the image surface Q5 can be maintained conjugate with each other in both longitudinal and lateral directions, thereby preventing axial astigmatism from occurring.

Embodiment 3

FIGS. 5A and 5B are schematic views showing the configuration of the projection optical system in accordance with the present embodiment including a Galilean cylindrical afocal zoom system. FIGS. 5A and 5B respectively show the same optical system in two surface directions which are orthogonal to each other including an optical axis, namely, in longitudinal and lateral directions.

Figure 6:
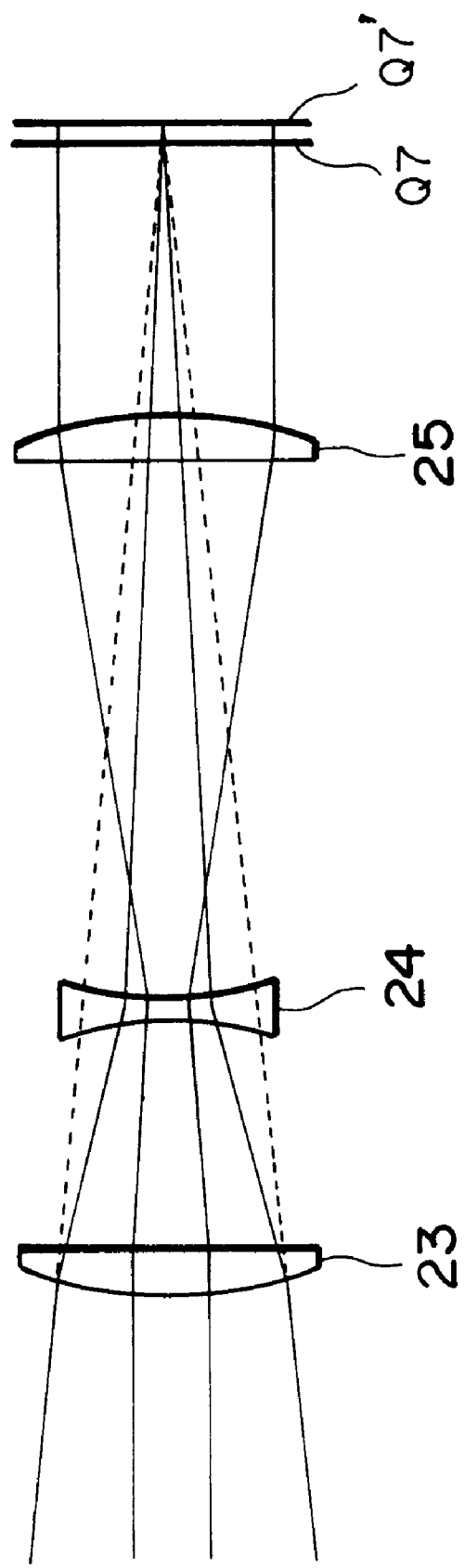
FIG. 6 is an enlarged view showing an optical path of the Galilean cylindrical afocal zoom system in the projection optical system shown in FIGS. 5A and 5B.

Also, FIG. 6, which corresponds to FIG. 5A, is an enlarged view showing the optical path of the Galilean cylindrical afocal zoom system in the projection optical system of FIG. 5A.

As shown in FIG. 5A, when the optical system is viewed in the longitudinal direction, three cylindrical lenses 23, 24, and 25, whose generating lines each extend in the lateral direction, form a Galilean cylindrical afocal zoom system composed of three members as a shaping optical system. The cylindrical lenses 23, 24, and 25 respectively have a positive refractive power, a negative refractive power, and a positive refractive power in the longitudinal direction.

Also, between the cylindrical afocal zoom system (23 to 25) and its object surface Q6, two spherical lenses 21 and 22, as a pair, form a Keplerian afocal system.

Accordingly, in the longitudinal direction, a parallel bundle of rays emitted from the object surface Q6 is magnified or reduced while passing through the Keplerian afocal system (21, 22). Then, after being magnified or reduced by the cylindrical afocal zoom system (23 to 25), the bundle of rays reaches an image surface Q7'. Namely, in the longitudinal direction, the magnification or reduction of the bundle of rays emitted from the object surface Q6 depends on the Keplerian afocal system (21, 22) and the cylindrical afocal zoom system (23 to 25).

In the lateral direction, on the other hand, the cylindrical afocal zoom system (23 to 25) has no power. Accordingly, the cylindrical afocal zoom system (23 to 25) neither magnifies nor reduces the bundle of rays. Namely, in the lateral direction, the magnification or reduction of the bundle of rays emitted from the object surface Q6 solely depends on the Keplerian afocal system (21, 22).

In the case of the cylindrical afocal zoom system (23 to 25) composed of three members as shown in FIG. 6, equations for determining conditions under which no axial astigmatism occurs are more complicated than those for the above-mentioned cylindrical afocal system composed of two members. Nevertheless, it is of course theoretically possible for these conditions to be determined by calculation.

Here, in order to actually determine the conditions under which no axial astigmatism occurs for the cylindrical afocal zoom system (23 to 25), there is also a method in which the image point position is calculated by paraxial calculation while changing the object point distance and then a lens arrangement in which the distance between the object point and the image point in the longitudinal direction coincides with the distance D between the object point and the image point in the lateral direction is found by trial and error.

In FIG. 6, the optical system is configured such that an image of a conjugate surface Q7 of the object surface Q6 is formed at the surface Q7'. Also, the distance between the surfaces Q7 and Q' coincides with the distance D between the object point and the image point in the lateral direction shown in FIG. 5B. Accordingly, as shown in FIGS. 5A, 5B, and 6, the Keplerian afocal system (21, 22) can form an image of the object surface Q6 at the surface Q7, while light from the image formed at the surface Q7 can be relayed by the cylindrical afocal zoom system (23 to 25) so as to form an image at the image surface Q7' in both longitudinal and lateral directions. In other words, in both longitudinal and lateral directions, the object surface Q6 and the image surface Q7' can be maintained conjugate with each other so as to prevent axial astigmatism from occurring.

In the case of the zoom system, the distance between the object surface (or its conjugate surface) and cylindrical lens 23 by which no axial astigmatism occurs may vary according to zooming (variable power). In this case, when the cylindrical afocal zoom system (23 to 25) is integrally moved along the optical axis together with zooming, fluctuations of the virtual image surface Q7' can be corrected, thereby preventing axial astigmatism from occurring.

Embodiment 4

Figure 7:
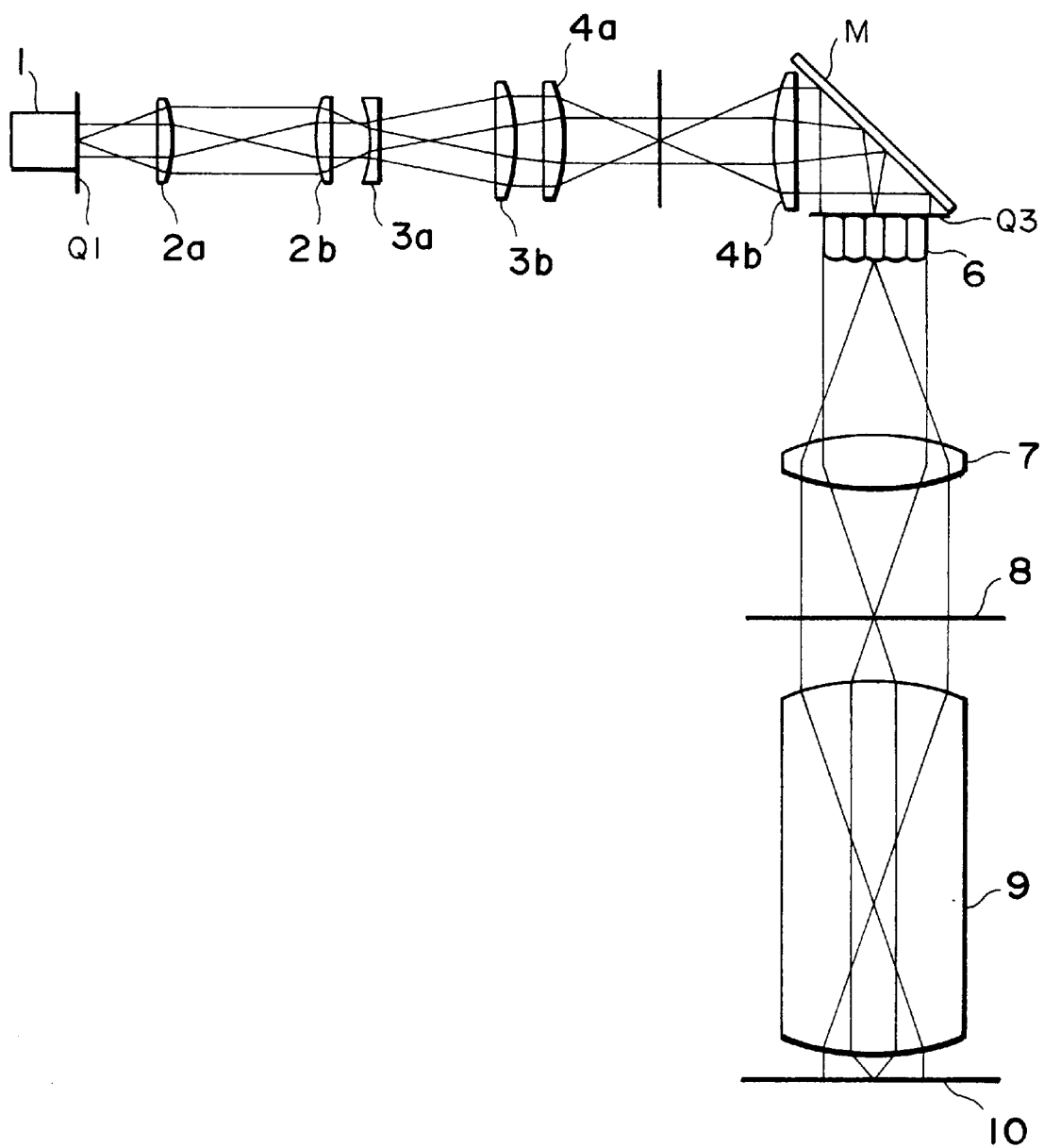
FIG. 7 is a schematic view showing a configuration of an exposure apparatus in accordance with Embodiment 4 of the present invention provided with the projection optical system of the present invention.

FIG. 7 is a schematic view showing a configuration of an exposure apparatus in accordance with the present embodiment provided with the projection optical system of the present invention.

The depicted exposure apparatus is equipped with a light source 1 for supplying a parallel bundle of rays to an object surface Q1 of the projection optical system. The parallel bundle of rays emitted from the light source 1 (e.g., excimer laser) is shaped into a parallel bundle of rays having a predetermined cross-sectional shape by way of the projection optical system (beam-shaping optical system) comprising a first Keplerian afocal system (2a, 2b), a cylindrical afocal system (3a, 3b), and a second Keplerian afocal system (4a, 4b). Thus shaped bundle of rays is reflected downward in this drawing by a mirror M and then guided to a light-receiving surface of a fly-eye lens 6 which is a multiple light source forming system positioned at an image surface Q3 of the projection optical system.

The light incident on the fly-eye lens 6 is two-dimensionally divided by a plurality of lens elements constituting the fly-eye lens 6, thereby forming a plurality of secondary light sources in the proximity of its light-emitting surface. Light components from a plurality of the secondary light sources are converged by a condenser lens 7 so as to illuminate, in a superposing manner, a mask (projection original) 8 having a pattern. Thus, a very uniform illuminance distribution is formed on the mask 8.

The light transmitted through the mask 8 reaches, by way of a projection lens 9, a wafer surface 10 which is a substrate positioned at the image surface of the projection lens 9. In this manner, the pattern formed in the mask 8 is transferred to the wafer surface 10 by the projection lens 9.

Here, in cases where the light source 1 is a light source such as excimer laser which emits a rectangular bundle of rays, when light is guided to the fly-eye lens 6 having substantially a square cross-sectional shape, the rectangular bundle of rays from the light source 1 should to be shaped into substantially a square shape by the projection optical system. Also, in order to attain a greater tolerance for angular fluctuation of the light source 1 itself, the light-emitting surface Q1 (i.e., object surface of the projection optical system) and the light-receiving surface Q3 (i.e., image surface of the projection optical system) of the fly-eye lens 6 should be optically substantially conjugate with each other in both longitudinal and lateral directions. As a result of this feature, even when the angle at which a beam is emitted from the light source 1 is shifted, the beam is prevented from positionally shifting at the light-receiving surface Q3 of the fly-eye lens 6.

The laser beam from the light source 1 may angularly fluctuate upon exchange of aged parts in the laser such as window, electrode, and chamber. In general, the amount of fluctuation in beam-emitting angle occurring due to maintenance of the excimer laser such as that mentioned above can be suppressed to about 3 mrad. The laser light source 1 and the fly-eye lens 6 may not be maintained strictly conjugate with each other. With respect to the angular fluctuation generated, the fluctuation in beam position at the light-receiving surface Q3 of the fly-eye lens 6 may be as large as about 10% of the size of the fly-eye lens 6.

Assuming that dimensions of the fly-eye lens 6 in the longitudinal and lateral directions are respectively H and W, it is preferable that the amount of movement of the beam position on the fly-eye lens 6 is within H/10 when the beam emitted from the light source is angularly shifted in the longitudinal direction by 3 mrad while being within W/10 when the beam emitted from the light source is angularly shifted in the lateral direction by 3 mrad. Accordingly, it is preferable that the amount of movement of the beam position on the fly-eye lens 6 in the longitudinal direction is within H/30 per 1 mrad of angular shift while that in the lateral direction is within W/30 per 1 mrad of angular shift. As a result of this feature, the image-forming positions in two directions orthogonal to each other within the secondary surface can be made substantially coincide with each other.

As previously explained in connection with Embodiment 1, when the projection optical system constituted by the first Keplerian afocal system (2a, 2b), the cylindrical afocal system (3a, 3b), and the second Keplerian afocal system (4a, 4b) is used, the cross section of the bundle of rays can be converted from a rectangular shape into substantially a square shape, while maintaining light-emitting surface Q1 of the light source 1 and the light-receiving surface Q3 of the fly-eye lens 6 conjugate with each other in both longitudinal and lateral directions. Accordingly, in the exposure apparatus in accordance with the present embodiment, loss in light quantity becomes smaller while a greater tolerance for angular fluctuation in the light source is attained.

Here, even in cases where the cross section of the fly-eye lens 6 is not square but has a shape with an aspect ratio which is other than 1:1, the magnification of the cylindrical afocal system (3a, 3b) can be changed so as to effect a shaping which corresponds to the cross-sectional shape of the fly-eye lens 6.

While the present embodiment shows an example in which the projection optical system in accordance with Embodiment 1 is applied to an exposure apparatus, the projection optical systems based on other embodiments of the present invention can also be applied to the exposure apparatus.

Embodiment 5

Figure 8:
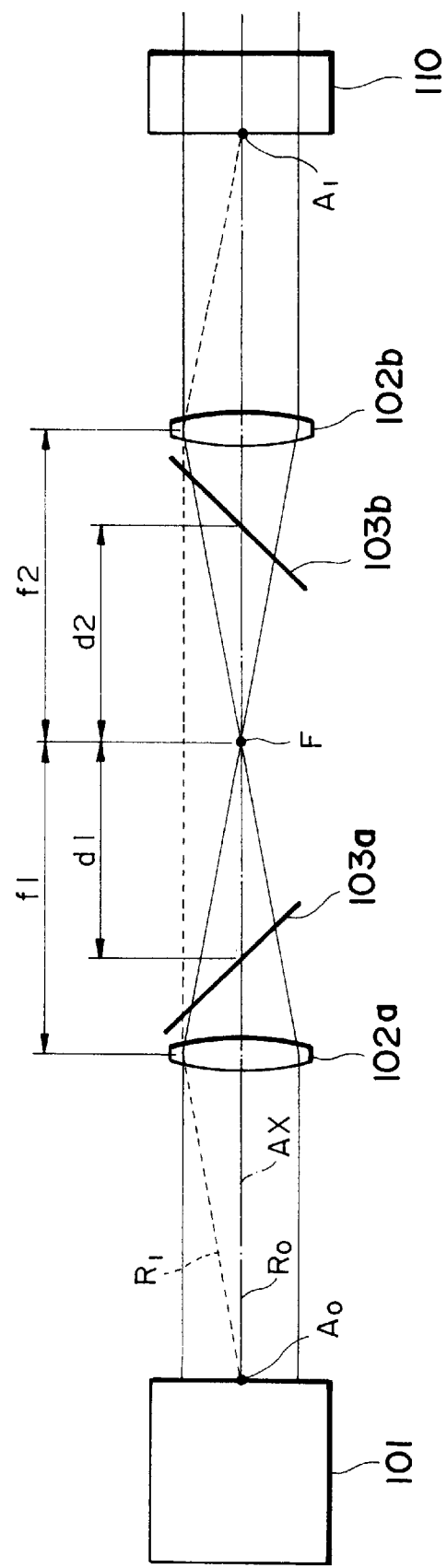
FIG. 8 is a development of optical path schematically showing a partial configuration of an illumination apparatus in accordance with Embodiment 5 of the present invention.

FIG. 8 schematically shows a partial configuration of the illumination apparatus in this embodiment.

This illumination apparatus comprises, as a light source means, an excimer laser light source 101, for example. A parallel bundle of rays from the excimer laser light source 101 is converged into a point F by way of a lens 102a, which is a first converging member, and forms a light source image. The light from the light source image is turned into a parallel bundle of rays by way of a lens 102b, which is a second converging member, and then illuminates an optical integrator 110.

Here, in FIG. 8, an exit point $A_0$ (i.e., point on a predetermined first surface) of the excimer laser light source 101 is disposed at a front-side (object-side) focal position of the lens 102a. Also, the rear-side (image-side) focal position of the lens 102a and the front-side focal position of the lens 102b are configured so as to coincide with each other. Further, an inlet point $A_1$ (i.e., point on a predetermined second surface) of the optical integrator 110 is disposed at the rear-side focal position of the lens 102b. Thus, the two lenses 102a and 102b constitute a first relay lens system which makes the laser exit surface (predetermined first surface) and the inlet surface (predetermined second surface) of the optical integrator conjugate with each other.

Accordingly, the whole bundle of rays from the laser light source 101 can efficiently illuminate the optical integrator 110 even when a principal ray $R_0$ is tilted with respect to the designed optical axis AX, due to factors such as the initial positional deviation of the laser light source 101 and the positional deviation of optical members caused by vibration, so as to become a light beam $R_1$ as shown by a broken line in FIG. 8.

In this illumination apparatus, the two relay lenses 102a and 102b respectively have focal lengths f1 and f2. A reflective mirror 103a is disposed in the optical path between the position F where the light source image is formed (i.e., position separated from the rear-side principal point of the relay lens 102a by the focal length f1 along the optical axis AX) and the relay lens 102a.

Also, a reflective mirror 103b is disposed in the optical path between the position F where the light source image is formed (i.e., position separated from the front-side principal point of the relay lens 102b by the focal length f2 along the optical axis AX) and the relay lens 102b.

These two reflective mirrors 103a and 103b are disposed at positions which are respectively separated from the position F by distances d1 and d2 along the optical axis AX. Thus, as indicated in Embodiment 6 which will be explained later, the bundle of rays from the laser light source 101 is three-dimensionally drawn around by way of the two reflective mirrors 103a and 103b and then introduced onto the inlet surface of the optical integrator 110.

For example, the excimer laser light source 101 is originally a light source which generates ultraviolet rays, thereby emitting a bundle of rays with a very high energy. Accordingly, when the parallel bundle of rays from the laser light source 101 is converged by the relay lens 102a, the converged bundle of rays has a greater optical energy density as it travels further from the relay lens 102a, maximizing the optical energy density at the converging point F. Namely, the optical energy density of the light incident on the two reflective mirrors 103a and 103b change depending on the positions where they are disposed.

Specifically, optical energy densities $E_a$ and $E_b$ of light components respectively incident on the two reflective mirrors 103a and 103b which are respectively separated from the converging position F by distances d1 and d2 are respectively expressed by the following two expressions (8) and (9):

$$E_a = E_0 (f1/d1)^2 \quad (8)$$

$$E_b = E_0 (f1/d2)^2 \quad (9)$$

wherein $E_0$ is the optical energy density of the light emitted from the relay lens 102a.

A normal reflective mirror, on the other hand, has been constituted by a plane glass substrate and a single thin layer or multiple thin layers of metal or dielectric coated thereon by vapor deposition. The following Table 3 shows materials, reflectances, and energy resistances of typical reflective mirror films used for KrF excimer laser beam (wavelength at 248 nm). Here, since the KrF excimer laser light is pulse laser light, the energy resistance shown in Table 3 refers to a single-shot energy, i.e., energy resistance to one pulse of the laser beam.

TABLE 3

| Material | Reflectance | Energy resistance |
|---|---|---|
| $HfO_2/SiO_2$ | 98.4% | 1.0 J/cm$^2$ |
| $Al_2O_{3/NaF}$ | 91.9% | 1.7 J/cm$^2$ |
| $ThF_4/NaAl_{12}$ | 96.1% | 2.8 J/cm$^2$ |

By way of an example, the standard optical energy density of a narrow-band KrF excimer laser beam is about 20 mJ/cm$^2$. Also, the light emitted from the excimer laser light source 101 is usually a parallel bundle of rays. Accordingly, even when a reflective mirror is disposed in the parallel bundle of rays between the excimer laser light source 101 and the relay lens 102a or between the relay lens 102b and the optical integrator 110, since the energy resistance of the reflective mirror shown in Table 3 is much greater than the optical energy density of the parallel bundle of rays, the reflective mirror is prevented from being damaged.

Nevertheless, in the optical path between the excimer laser light source 101 and the relay lens 102a, it is necessary to dispose an optical member such as plane parallel plate or mirror in order to adjust the inclination or positional deviation of the laser beam from the excimer laser light source 101 with respect to the optical axis AX. Also, in the optical path between the relay lens 102b and the optical integrator 110, it is necessary to dispose an optical member such as cylinder beam expander in order to expand the bundle of rays. Accordingly, for the convenience of disposition of these optical members, the two reflective mirrors 103a and 103b must be disposed between the two relay lenses 102a and 102b.

As mentioned above, when a reflective mirror is disposed in the converged bundle of rays, the light incident thereon has a greater optical energy density as it is closer to the converging point F. In this case, in order to prevent the reflective mirror from being damaged, the optical energy density E of the light incident on the reflective mirror must be made smaller than tolerable optical energy density $E_d$ of the reflective mirror.

Here, the tolerable optical energy density $E_d$ of the reflective mirror should be defined not by the short-term energy resistance shown in Table 3 but by a long-term energy resistance which extends to a predetermined period, for example, five years.

Assuming that a frequency of the irradiation pulse of the excimer laser light source 101 is 500 Hz, when continuously irradiated with this laser for five years, the reflective mirror is irradiated with about $1 \times 10^{11}$ pulses of the laser beam in total. Though no specific values have been confirmed for the long-term energy resistance upon irradiation with such an order of the pulse number, it has been empirically known that the long-term energy tolerance of the $HfO_2/SiO_2$ reflective film, which has the lowest short-term energy resistance in Table 3, is about 250 mJ/cm². Accordingly, when the excimer laser light source 101 is used, the tolerable optical energy density $E_d$ of the reflective mirror can be defined as 250 mJ/cm², for example.

Thus, based on the defined tolerable optical energy density $E_d$, a condition under which the reflective mirror 103a is prevented from being damaged upon energy irradiation can be determined. Namely, in the above-mentioned expression (8), as a condition under which the optical energy density $E_a$ of the light incident on the reflective mirror 103a becomes smaller than the tolerable optical energy density $E_d$, the following conditional expression (10) can be obtained:

$$E_0(f1/d1)^2 < E_d \tag{10}$$

Here, the focal length f1 of the relay lens 102a is distance $D_1$ between the relay lens 102a and the light source image forming position F along the optical axis. Also, the distance d1 of the reflective mirror 103a, which is disposed so as to satisfy conditional expression (10), from the converging position F along the optical axis AX is a predetermined distance $D_0$ of the reflective mirror 103a, which is disposed so as not to be damaged upon energy irradiation, from the light source image forming position F.

Thus, the condition under which the reflective mirror 103a is prevented from being damaged upon energy irradiation must be none other than that the predetermined distance Do satisfies the following conditional expression (11):

$$D_0 > D_1(E_0/E_d)^{1/2} \tag{11}$$

This conditional expression (11) is also applicable to the other reflective mirror 103b as it is. Thus, in the present invention, as the reflective mirrors are separated from the light source image forming position F by the predetermined distance $D_0$ defined by conditional expression (11), they can be securely prevented from being damaged upon energy irradiation.

Embodiment 6

Figure 9:
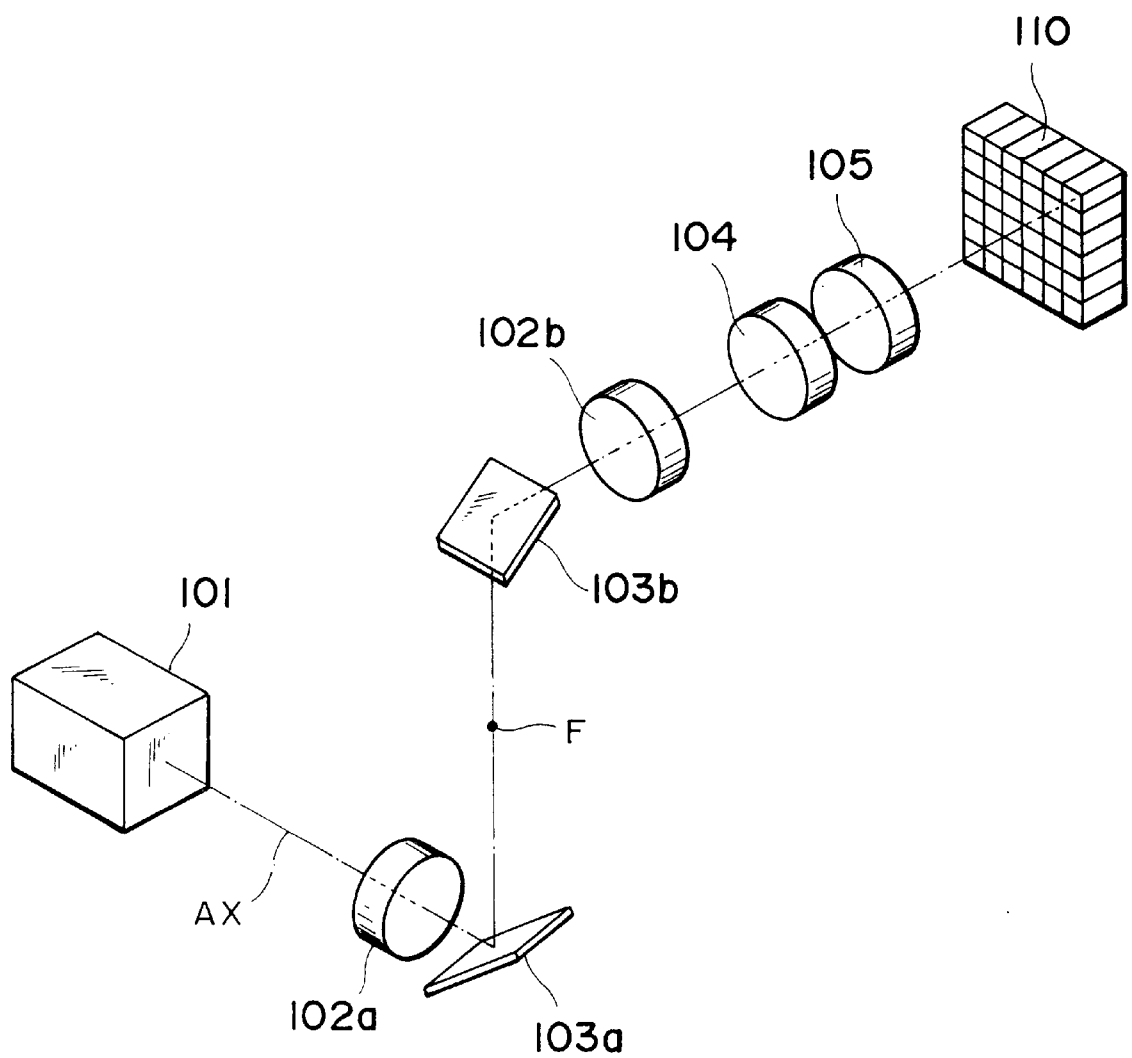
FIG. 9 is a perspective view schematically showing a configuration of an illumination apparatus in accordance with Embodiment 6 of the present invention provided with the projection optical system of the present invention.

FIG. 9 is a perspective view schematically showing a configuration of the illumination apparatus in accordance with this embodiment. Also, FIGS. 10A and 10B are developments of optical path corresponding to FIG. 9, respectively showing configurations in two orthogonal planes including the optical axis. Here, in FIGS. 10A and 10B, an expander 105 of FIG. 9 is omitted.

The illumination optical system of this illumination apparatus comprises the two relay lenses 102a and 102b as the Keplerian afocal system (2a and 2b) of the above-mentioned Embodiment 1, while having two cylindrical lenses 104a and 104b as the Galilean afocal system (3a and 3b) of the above-mentioned Embodiment 1. Accordingly, images of the exit surface of the laser light source 101 are formed at the same position in the longitudinal and lateral directions based on magnifications different from each other in the longitudinal and lateral directions. Namely, since the exit surface of the laser light source 101, which is the object surface, and the inlet surface of the optical integrator 110, which is the image surface, keep their optically conjugate relationship in both longitudinal and lateral directions, no axial astigmatism is generated.

This illumination apparatus comprises the laser light source 101 such as an excimer laser which emits wavelength light of 248 nm or 193 nm, for example. A rectangular parallel bundle of rays emitted from the laser light source 101 is converged by way of the relay lens 102a, is reflected by the reflective mirror 103a toward the vertical direction in FIG. 9, and then forms a light source image (secondary light source) at the position F. The light from the light source image is reflected by the reflective mirror 103b toward the horizontal direction in FIG. 9 and then made incident on the relay lens 102b. The illumination light which has become a parallel bundle of rays by way of the relay lens 102b is made incident on a cylinder expander 104 composed of a cylindrical negative lens 104a and a cylindrical positive lens 104b.

The pair of cylindrical lenses 104a and 104b have refractive powers within the plane shown in FIG. 10B, while functioning as plane parallel plates within the plane shown in FIG. 10A. Accordingly, the bundle of rays incident on the cylinder expander 104 is expanded within the plane shown in FIG. 10B, while passing therethrough as it is within the plane shown in FIG. 10A. The bundle of rays thus shaped by the cylinder expander 104 is made incident on the expander 105. The expander 105 two-dimensionally magnifies the bundle of rays within a plane perpendicular to the optical axis AX such that the shape of the inlet surface of the optical integrator 110, which will be explained later, and the shape of the bundle of rays substantially coincide with each other.

The light which has passed through the expander 105 is made incident on the optical integrator 110 which is a multiple light source forming system. The bundle of rays incident on the optical integrator 110 is two-dimensionally divided by a plurality of lens elements constituting the optical integrator 110, whereby a plurality of light source images, i.e., tertiary light sources, are formed at the rear-side focal position of the optical integrator 110. Here, respective bundles of rays from the plurality of light source images are converged by a converging optical system shown in Embodiment 8, which will be explained later, and then, in a superposing manner, illuminate the surface to be irradiated.

Here, in FIGS. 10A and 10B, the exit surface of the excimer laser light source 101 is disposed at the front-side focal position of the relay lens 102a. Also, the rear-side focal position of the relay lens 102a and the front-side focal position of the relay lens 102b are configured so as to coincide with each other. Further, the inlet surface of the optical integrator 110 is disposed at the rear-side focal position of the relay lens 102b. Thus, the two relay lenses 102a and 102b constitute a first relay lens system which makes the exit surface of the excimer laser light source 101 and the inlet surface of the optical integrator 110 conjugate with each other.

On the other hand, the optical integrator 110 and the converging optical system shown in Embodiment 8, which will be explained later, constitute a second relay lens system which makes the inlet surface of the optical integrator 110 and the surface to be irradiated conjugate with each other.

Accordingly, even when the emission angle of the laser light from the laser light source 101 deviates from the optical axis and thereby the principal ray of the emitted bundle of rays is tilted with respect to the designed optical axis AX as indicated by broken lines in FIG. 10A and 10B, the whole bundle of rays from the laser light source 101 can efficiently illuminate the optical integrator 110 without positionally shifting along in-plane directions with respect to the inlet surface of the optical integrator 110.

As shown in FIGS. 10A and 10B, the two relay lenses 102a and 102b respectively have focal lengths f1 and f2. Also, the two reflective mirrors 103a and 103b are disposed at positions which are respectively separated from the position F, at which the light source image is formed, along the optical axis AX by distances d1 and d2. Here, the distances d1 and d2 are defined on the basis of the required distance $D_0$, which is defined according to the above-mentioned Embodiment 5, such that the two reflective mirrors 103a and 103b are prevented from being damaged upon energy irradiation.

In the following, based on a specific example of values, the required distance $D_0$ will be studied in the case where a narrow-band KrF excimer laser light source is used as the laser light source 101 while a reflective mirror formed by vapor deposition of an $HfO_2/SiO_2$ reflective film is used as each of the two reflective mirrors 103a and 103b.

Here, it is assumed that, due to the restriction on the floor space within a clean room, only the optical path length of 1 m or less, for example, can be secured between the laser exit surface of the laser light source 101 and the inlet surface of the optical integrator 110.

In this case, since the laser exit surface of the laser light source 101 and the inlet surface of the optical integrator 110 are optically conjugate with each other, when the first relay lens system is constituted by a pair of positive lenses (102a and 102b), the focal length of each of the two relay lenses 102a and 102b is substantially univocally determined as about 250 mm on the basis of calculation 1 m/4=250 mm. Namely, the distance $D_1$ between the light source image forming position F and the relay lens 102a or 102b becomes about 250 mm.

Also, as explained in the above-mentioned Embodiment 5, the tolerable optical energy density $E_d$ of the reflective mirror coated with the $HfO_2/SiO_2$ reflective film by vapor deposition is about 250 mJ/cm². Further, the optical energy density $E_0$ of the light emitted from the relay lens 102a, which is substantially the same as the standard optical energy density of the parallel bundle of rays from the narrow band KrF excimer laser beam, is about 20 mJ/cm².

Accordingly, when specific values of the distance $D_1$, tolerable optical energy density $E_d$, and optical energy density $E_0$ are input into the above-mentioned expression (11), the required distance $D_0$ can be determined by the following expression (12):

$$D_0 > 250(20/250)^{1/2} = 70.7 \text{ mm} \qquad (12)$$

Thus, when the two reflective mirrors 103a and 103b are respectively disposed at positions which are separated from the light source image forming position F by the required distance $D_0$=about 71 mm or longer, the two reflective mirrors 103a and 103b can be securely prevented from being damaged by energy irradiation under a predetermined condition.

Embodiment 7

Figure 11:
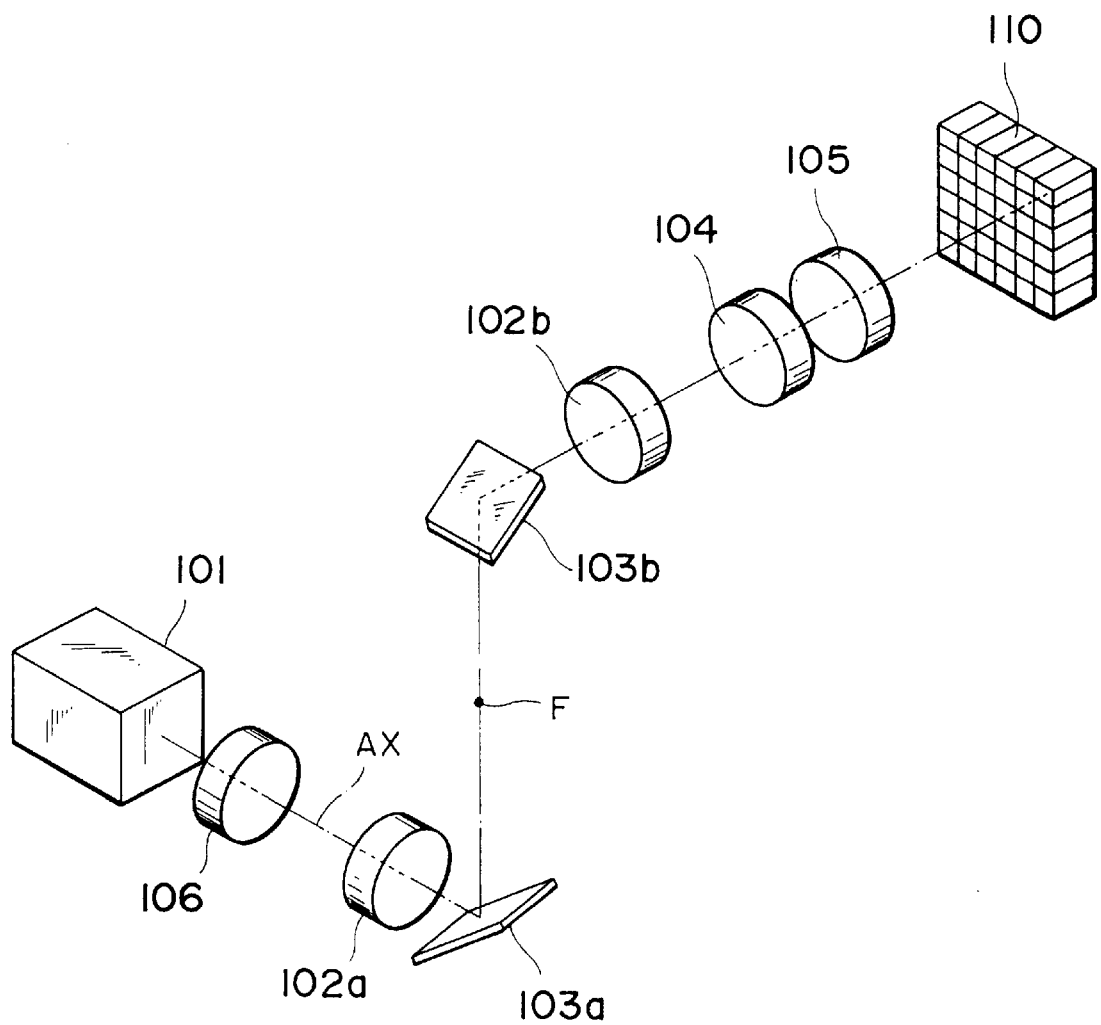
FIG. 11 is a perspective view schematically showing a configuration of an illumination apparatus in accordance with Embodiment 7 of the present invention provided with the projection optical system of the present invention.

FIG. 11 is a perspective view schematically showing a configuration of the illumination apparatus in accordance with this embodiment as a modified example of the illumination apparatus in the above-mentioned Embodiment 6. The configuration of this illumination apparatus basically differs from that of the above-mentioned Embodiment 6 only in that an expander 106 is disposed in the optical path between the excimer laser light source 101 and the relay lens 102a.

Thus, this illumination apparatus can magnify, by a predetermined enlarging magnification, the rectangular parallel bundle of rays emitted from the excimer laser light source 101. Accordingly, the optical energy density $E_0$ of the light emitted from the relay lens 102a can be reduced by the square of the magnification of the beam expander 106. As a result, the value of the required distance $D_0$ for eliminating the damages caused by energy irradiation can be made smaller. Accordingly, this embodiment is quite advantageous in the case where there is a restriction against making the reflective mirror so close to the relay lens.

Embodiment 8

Figure 12:
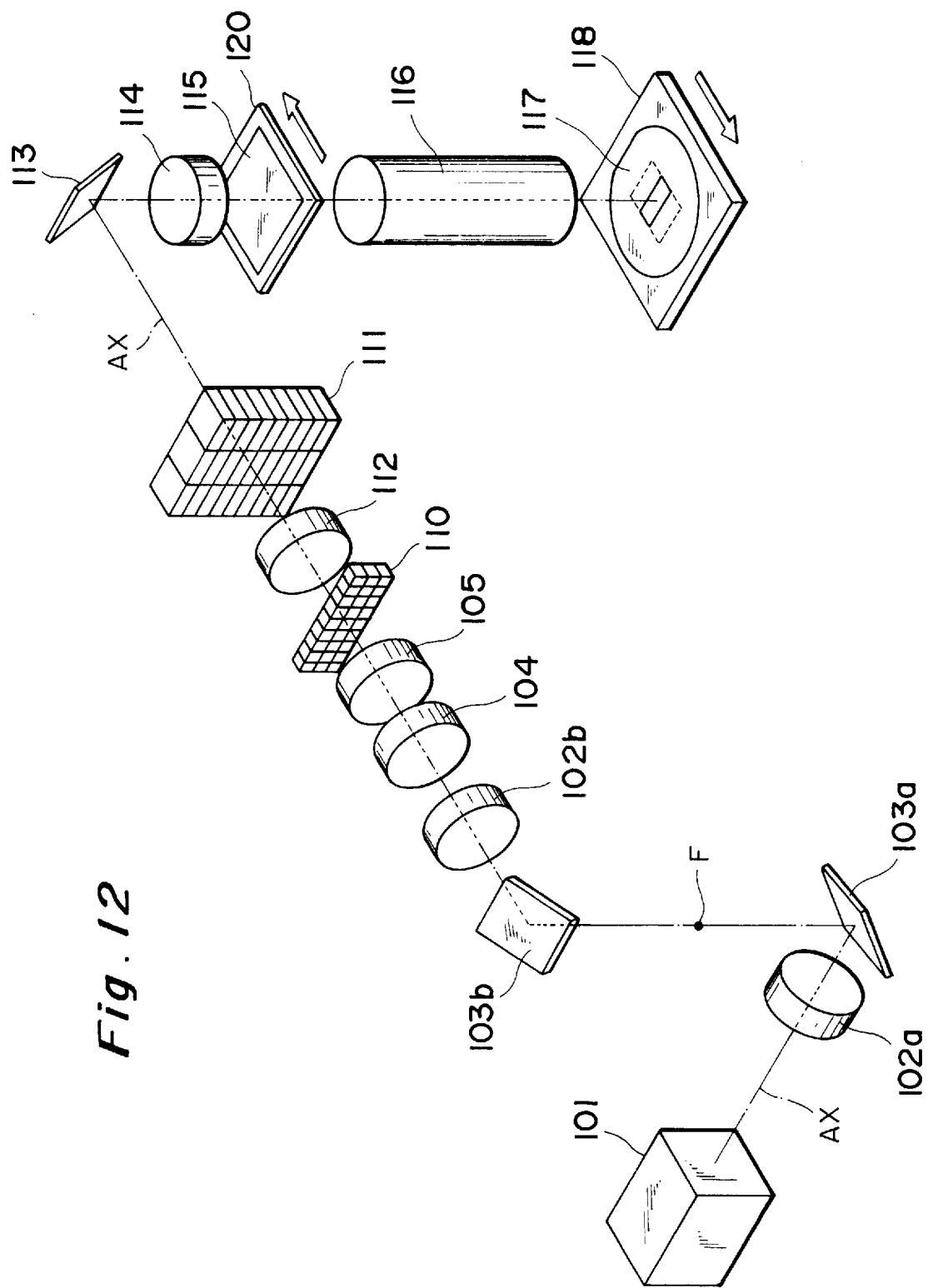
FIG. 12 is a perspective view schematically showing a configuration of an exposure apparatus in accordance with Embodiment 8 of the present invention loaded with the illumination apparatus of the present invention.

FIG. 12 is a perspective view schematically showing a configuration of the projection exposure apparatus in accordance with this embodiment.

Here, in this embodiment, the present invention is applied to a so-called scan type projection exposure apparatus in which exposure is effected while each of a mask and a photosensitive substrate is relatively moved with respect to a projection optical system. Also, in this scan type projection exposure apparatus, an illumination apparatus having basically the same configuration as that of the illumination apparatus of the above-mentioned Embodiment 6 is incorporated.

This projection exposure apparatus comprises the laser light source 101 such as an excimer laser which emits wavelength light of 248 nm or 193 nm, for example. A rectangular parallel bundle of rays emitted from the laser light source 101 is converged by way of the relay lens 102a, is reflected by the reflective mirror 103a toward the vertical direction in FIG. 12, and then forms a light source image (secondary light source) at the position F. The light from the light source image is reflected by the reflective mirror 103b toward the horizontal direction in FIG. 12 and then made incident on the relay lens 102b.

The illumination light which has become a parallel bundle of rays by way of the relay lens 102b is successively made incident on the cylinder expander 104, which is composed of the two cylindrical lenses 104a and 104b, and the expander 105. The two expanders 104 and 105 shape the bundle of rays so as to make it substantially coincide with the shape of the inlet surface of the first optical integrator 110 which will be explained later.

The bundle of rays thus shaped by way of the cylinder expander 104 and the expander 105 is made incident on the first optical integrator 110 which is a multiple light source forming system. The bundle of rays incident on the first optical integrator 110 is two-dimensionally divided by a plurality of lens elements constituting the optical integrator 110, whereby a plurality of light source images, i.e., tertiary light sources, are formed at the rear-side focal position of the optical integrator 110.

The bundles of rays from the plurality of light source images are converged by a converging optical system 112 composed of a pair of lenses, for example, and then illuminate a second optical integrator 111, which is similarly a multiple light source forming system, in a superposing manner. The bundle of rays incident on the second optical integrator 111 is two-dimensionally divided by a plurality of lens elements constituting the optical integrator 111, whereby a plurality of light source images, i.e., quaternary light sources, are formed at the rear-side focal position of the optical integrator 111.

Here, the converging optical system 112 makes the inlet surface of the first optical integrator 110 and the inlet surface of the second optical integrator 111 conjugate with each other, while making the exit surface of the first optical integrator 110 and the exit surface of the second optical integrator 111 conjugate with each other.

Each of the lens elements in the first and second optical integrators 110 and 111 has a biconvex lens form, for example. The parallel bundle of rays incident on each lens element is converged so as to form a light source image on the exit side of each lens element.

The bundles of rays from a plurality of light source images formed by way of the second optical integrator 111 are reflected by a bending mirror 113 toward the vertical direction in FIG. 12 and then made incident on a condenser lens 114. The bundles of rays converged by the condenser lens 114 illuminate, in a superposing manner, a mask 115 having a predetermined pattern. The bundle of rays transmitted through the mask 115 reaches, by way of a projection exposure optical system 116, a wafer 117 positioned at the image surface thereof. Thus, a pattern image of the mask 115 is formed on the wafer 117 which is a photosensitive substrate.

Thus, the first optical integrator 110, the converging optical system 112, the second optical integrator 111, and the condenser lens 115 constitute a second relay lens system which makes the inlet surface (predetermined second surface) of the first optical integrator 110 and the mask 115, which is the surface to be irradiated, conjugate with each other.

Here, the wafer 117 is mounted on a wafer stage 118 which is two-dimensionally movable within a plane which is perpendicular to the optical axis AX. On the other hand, the mask 115 is mounted on a mask stage 120 which is two-dimensionally movable within a plane which is perpendicular to the optical axis AX.

Thus, as exposure is effected while the mask 115 and the wafer 117 are relatively moved with respect to the projection optical system 116, patterns formed in the pattern area of the mask 115 can be successively transferred to the respective exposure areas on the wafer 117.

In the scan exposure such as that mentioned above, since both mask stage and wafer stage move during exposure, vibration is likely to occur. When the bundle of rays is drawn around by way of a relay lens system in order to eliminate the influence of vibration, the optical path is elongated such that it becomes necessary to bend the optical path by means of a reflective mirror as shown in FIG. 12.

In this embodiment, the two reflective mirrors 102a and 102b are positioned so as to be separated from the light source image forming position F, for example, by the predetermined distance $D_0$ which is defined by conditional expression (11). Accordingly, exposure can be stably effected over a long period without the two reflective mirrors 102a and 102b being damaged upon energy irradiation during the exposure.

Here, without being restricted to the foregoing embodiments, the present invention can be subjected to a variety of modifications.

For example, the above-mentioned Embodiments 1 to 4 show examples in which the cylindrical optical system is constituted by an afocal optical system. However, it is not always necessary for the cylindrical optical system to be constituted by an afocal optical system in order to attain the effects of the present invention.

Also, the above-mentioned Embodiments 1 to 4 show examples in which the secondary image-forming optical system (relay optical system) disposed on at least one of the object surface side and image surface side of the cylindrical optical system is constituted by an afocal optical system. However, it is not always necessary for the secondary image-forming optical system to be constituted by an afocal optical system in order to attain the effects of the present invention.

Also, the above-mentioned Embodiments 1 to 4 show examples in which the projection optical system, as a whole, is constituted by an afocal optical system. However, it is not always necessary for the projection optical system to be constituted by an afocal optical system in order to attain the effects of the present invention.

Also, while the above-mentioned Embodiments 1 to 4 explain cases where the projection optical system has a cylindrical optical system, the present invention is also applicable to the cases where a toric optical system is used.

Also, the above-mentioned Embodiments 5 to 8 show examples in which excimer laser is used as the light source. The present invention, however, can also be applied to other light-supplying means.

Also, the above-mentioned Embodiments 5 to 8 show examples in which reflective mirrors are used as deflecting member. The present invention, however, can also be applied to other deflecting means such as a prism having a reflective film.

Also, the above-mentioned Embodiment 8 shows a scan type exposure apparatus. The present invention, however, can also be applied to a step-and-repeat type exposure apparatus.

Further, in the above-mentioned Embodiments 6 to 8, the first relay lens system is disposed upstream of the cylindrical expander. The first relay lens system, however, can also be disposed downstream of the cylindrical expander.

As explained in the foregoing, in the projection optical system of the present invention, with only one set of a cylindrical optical system, an image of an object surface can be projected onto an image surface while being magnified or reduced with its longitudinal and lateral magnifications independent from each other. Namely, its cost can be reduced since it does not require two sets of cylindrical afocal systems whose generating lines are orthogonal to each other. Also, since all the generating lines of the cylindrical lens are in the same direction, the direction of the generating lines of the cylindrical lens can be easily adjusted.

In the strictly meaning, a cylindrical surface has no power in the generating line direction. However, above-mentioned cylindrical surface, in the present invention, includes cases that the cylindrical surface has a slight power result from manufacturing errors and the like.

Further, in the exposure apparatus provided with the projection optical system of the present invention, the bundle of rays from the light source can be shaped according to the cross-sectional shape of the fly-eye lens without generating any axial astigmatism at the light-receiving surface of the fly-eye lens. Accordingly, an exposure apparatus with a smaller loss in light quantity loss and a great tolerance for angular fluctuation of the light source can be realized.

In the present invention, fly-eye lens is used as the multiple light source forming system, however, this system can also be applied to a square-pillar-like optical element as shown in U.S. Pat. No. 4,918,583. The U.S. Pat. No. 4,918,583 is hereby incorporated by reference. This element may be an inner surface reflection type element having a cross-section such as rectangular, circular and the like. In this case, it is preferable for the light-receiving surface of the square-pillar-like optical element and the light-emitting surface of a laser to be substantially conjugated with each other in both longitudinal and lateral directions.

In the above-mentioned Embodiments, only one optical integrator is provided, however, a plurality of optical integrator can also be provided in series as shown in the U.S. Pat. No. 4,918,583. This arrangement enables more uniform illuminance distribution on a surface to be illuminated such as a mask, wafer and the like. Moreover, the plurality of optical integrator can be composed of fly-eye lens, the square-pillar-like optical elements, or the arbitrary combination therebetween.

Also, As explained in the foregoing, the present invention can realize an illumination apparatus in which deflecting members are prevented from being damaged upon energy irradiation of a laser beam over a long period. Also, when the present invention is applied to a projection exposure apparatus, exposure can be stably effected over a long period.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No.53579/1995 filed on Feb. 17, 1995 and No.205306/1995 filed on Jul. 19, 1995, and the U.S. patent application Ser. No.08/603,001 filed on Feb. 16, 1996 are hereby incorporated by reference.

What is claimed is:

1. A shaping optical system for converting a bundle of rays from a first surface into a bundle of rays having a predetermined cross-sectional shape, said shaping optical system comprising:

a shaping optical unit which is disposed in an optical path between the first surface and a second surface and which has a refractive power in only one of two directions which are perpendicular to an optical axis of said shaping optical system and orthogonal to each other, said shaping optical unit comprises:

a first lens group which has a refractive power in only one of said two directions which are orthogonal to each other; and a second lens group which has a refractive power only in the direction in which said first lens group has the refractive power;

wherein said shaping optical unit sets said first surface conjugate with said second surface in said two directions orthogonal to each other.

2. A shaping optical system according to claim 1, further comprising a secondary image-forming optical system which is disposed in the optical path between said first surface and said shaping optical unit and converges a bundle of rays from said first surface so as to form an intermediate image, wherein said shaping optical unit re-forms an image of said intermediate image on said second surface.

3. A shaping optical system according to claim 1, further comprising a secondary image-forming optical system which is disposed in the optical path between said shaping optical unit and said second surface and re-forms, on said second surface, an image of said first surface formed by said shaping optical unit.

4. A shaping optical system according to claim 1, further comprising a first secondary image-forming optical system which is disposed in the optical path between said first surface and said shaping optical unit and converges a bundle of rays from said first surface so as to form an intermediate image and a second secondary image-forming optical system which is disposed in the optical path between said shaping optical unit and said second surface and re-forms, on said second surface, an image of said intermediate image formed by said shaping optical unit.

5. A shaping optical system according to claim 1, wherein said shaping optical unit is configured as an afocal optical system which converts a bundle of parallel rays incident thereon from said first surface into a bundle of parallel rays having a predetermined cross-sectional shape and wherein each of said first and second lens groups is constituted by a cylindrical lens.

6. A shaping optical system according to claim 1, wherein said projection optical unit, as a whole, is constituted as an afocal optical system which converts a bundle of parallel rays from said first surface into a bundle of parallel rays having a predetermined cross-sectional shape and introduces thus converted bundle of rays onto said second surface.

7. A shaping optical system according to claim 1, further comprising:

a relay optical system which is disposed in the optical path between said first surface and said shaping optical unit and sets a third surface, which is positioned between said first surface and said shaping optical unit, conjugate with said first surface;

wherein said relay optical system comprises a first converging member which converges a bundle of rays from said first surface so as to form an intermediate image, a second converging member which converges a bundle of rays from said intermediate image and introduces thus converged bundle of rays onto said third surface, and at least one deflecting member which is disposed in at least one of the optical path between said first converging member and said intermediate image and the optical path between said intermediate image and said second converging member while being separated from said intermediate image along an optical axis of said relay optical system by a predetermined distance defined depending on change in energy density of the bundle of rays between said first and second converging members, deflects the bundle of rays from said first converging member, and introduces thus deflected bundle of rays onto said second converging member.

8. A shaping optical system according to claim 7, wherein, based on energy density $E_0$ of light emitted from said first converging member, tolerable energy density $E_d$ which is tolerable by said at least one deflecting member during a predetermined period, and distance $D_1$ between said first converging member and said intermediate image along the optical axis, distance $D_0$ between said intermediate image and said at least one deflecting member is set so as to satisfy conditional expression:

$$D_0 > D_1(E_0 E_d)^{1/2}.$$

9. A shaping optical system according to claim 7, wherein said at least one deflecting member is a reflective mirror.

10. A shaping optical system according to claim 1, further comprising a relay optical system which is disposed in the optical path between said shaping optical unit and said second surface and sets a third surface, which is positioned between said shaping optical unit and said second surface, conjugate with said second surface;

wherein said relay optical system comprises a first converging member which converges a bundle of rays from said third surface so as to form an intermediate image, a second converging member which converges a bundle of rays from said intermediate image and introduces thus converged bundle of rays onto said second surface, and at least one deflecting member which is disposed in at least one of the optical path between said first converging member and said intermediate image and the optical path between said intermediate image and said second converging member while being separated from said intermediate image along an optical axis of said relay optical system by a predetermined distance defined depending on change in energy density of the bundle of rays between said first and second converging members, deflects the bundle of rays from said first converging member, and introduces thus deflected bundle of rays onto said second converging member.

11. A shaping optical system according to claim 10, wherein, based on energy density $E_0$ of light emitted from said first converging member, tolerable energy density $E_d$ which is tolerable by said at least one deflecting member during a predetermined period, and distance $D_1$ between said first converging member and said intermediate image along the optical axis, distance $D_0$ between said intermediate image and said at least one deflecting member is set so as to satisfy conditional expression:

$$D_0 > D_1(E_0/E_d)^{1/2}.$$

12. A shaping optical system according to claim 10, wherein said at least one deflecting member is a reflective mirror.

13. An illumination apparatus for illuminating a surface to be illuminated, said apparatus comprising:

a light source which supplies a bundle of rays having a predetermined cross-sectional shape; and a shaping optical system which converts a bundle of rays from a first surface into a bundle of rays having a predetermined cross-sectional shape on a predetermined second surface, said shaping optical system comprising:

a shaping optical unit which is disposed between an optical path between said first surface and a second surface and has a refractive power in only one of two directions which are perpendicular to an optical axis of said projection optical system and orthogonal to each other;

said shaping optical unit comprising:

a first lens group which has a refractive power in only one of said two directions which are orthogonal to each other; and a second lens group which has a refractive power only in the direction in which said first lens group has the refractive power; and said shaping optical system setting said first surface substantially and optically conjugate with said second surface in said two directions orthogonal to each other.

14. An illumination apparatus according to claim 13, wherein said shaping optical system further comprises a secondary image-forming optical system which is disposed in the optical path between said first surface and said shaping optical unit and converges a bundle of rays from said first surface so as to form an intermediate image, wherein said shaping optical unit re-forms an image of said intermediate image on said second surface.

15. An illumination apparatus according to claim 13, wherein said shaping optical system further comprises a secondary image-forming optical system which is disposed in the optical path between said shaping optical unit and said second surface and re-forms, on said second surface, an image of said first surface formed by said shaping optical unit.

16. An illumination apparatus according to claim 13, wherein said shaping optical system further comprises a first secondary image-forming optical system which is disposed in the optical path between said first surface and said shaping optical unit and converges a bundle of rays from said first surface so as to form an intermediate image and a second secondary image-forming optical system which is disposed in the optical path between said shaping optical system and said second surface and re-forms, on said second surface, an image of said intermediate image formed by said shaping optical unit.

17. An illumination apparatus according to claim 13, wherein said shaping optical unit is configured as an afocal optical system which converts a bundle of parallel rays incident thereon from said first surface into a bundle of parallel rays having a predetermined cross-sectional shape and wherein each of said first and second lens groups is constituted by a cylindrical lens.

18. An illumination apparatus according to claim 13, wherein said shaping optical system, as a whole, is constituted as an afocal optical system which converts a bundle of parallel rays from said first surface into a bundle of parallel rays having a predetermined cross-sectional shape and introduces thus converted bundle of rays onto said second surface.

19. An illumination apparatus according to claim 13, wherein said shaping optical system further comprises a first relay optical system which is disposed in the optical path between said first surface and said shaping optical system and sets a third surface, which is positioned between said first surface and said shaping optical unit, conjugate with said first surface and a second relay optical system which is disposed between said second surface and said surface to be irradiated and sets said second surface and said surface to be irradiated conjugate with each other, and wherein said first relay optical system comprises a first converging member which converges a bundle of rays from said first surface so as to form an intermediate image, a second converging member which converges a bundle of rays from said intermediate image and introduces thus converged bundle of rays onto said third surface, and at least one deflecting member which is disposed in at least one of the optical path between said first converging member and said intermediate image and the optical path between said intermediate image and said second converging member while being separated from said intermediate image along an optical axis of said first relay optical system by a predetermined distance defined depending on change in energy density of the bundle of rays between said first and second converging members, deflects the bundle of rays from said first converging member, and introduces thus deflected bundle of rays onto said second converging member.

20. An illumination apparatus according to claim 19, wherein, based on energy density $E_0$ of light emitted from said first converging member, tolerable energy density $E_d$ which is tolerable by said at least one deflecting member during a predetermined period, and distance $D_1$ between said first converging member and said intermediate image along the optical axis, distance $D_0$ between said intermediate image and said at least one deflecting member is set so as to satisfy conditional expression:

$$D_0 > D_1 (E_0/E_d)^{1/2}.$$

21. An illumination apparatus according to claim 19, wherein said second relay optical system comprises a multiple light source forming system which forms a plurality of light source images based on the bundle of rays from said shaping optical unit and a condenser optical system which converges the bundle of rays from each of said plurality of light source images so as to illuminate, in a superposing manner, said surface to be irradiated, said first surface coinciding with an exit surface of said light source.

22. An illumination apparatus according to claim 19, wherein said light source is an excimer laser light source and wherein said at least one deflecting member is a reflective mirror.

23. An illumination apparatus according to claim 19, wherein said shaping optical system further comprises a ray bundle magnifying system which is disposed in the optical path between said excimer laser light source and said first relay optical system and magnifies a bundle of parallel rays from said excimer laser light source.

24. An illumination apparatus according to claim 13, wherein said shaping optical system further comprises a first relay optical system which is disposed in the optical path between said shaping optical system and said second surface and sets a third surface, which is positioned between said shaping optical unit and said second surface, conjugate with said second surface and a second relay optical system which is disposed between said second surface and said surface to be irradiated and sets said second surface and said surface to be irradiated conjugate with each other, and wherein said first relay optical system comprises a first converging member which converges a bundle of rays from said third surface so as to form an intermediate image, a second converging member which converges a bundle of rays from said intermediate image and introduces thus converged bundle of rays onto said second surface, and at least one deflecting member which is disposed in at least one of the optical path between said first converging member and said intermediate image and the optical path between said intermediate image and said second converging member while being separated from said intermediate image along an optical axis of said first relay optical system by a predetermined distance defined depending on change in energy density of the bundle of rays between said first and second converging members, deflects the bundle of rays from said first converging member, and introduces thus deflected bundle of rays onto said second converging member.

25. An illumination apparatus according to claim 24, wherein, based on energy density $E_0$ of light emitted from said first converging member, tolerable energy density $E_d$ which is tolerable by said at least one deflecting member during a predetermined period, and distance $D_1$ between said first converging member and said intermediate image along the optical axis, distance $D_0$ between said intermediate image and said at least one deflecting member is set so as to satisfy conditional expression:

$$D_0 > D_1 (E_0/E_d)^{1/2}.$$

26. An illumination apparatus according to claim 24, wherein said second relay optical system comprises a multiple light source forming system which forms a plurality of light source images based on a bundle of rays from said shaping optical unit and a condenser optical system which converges a bundle of rays from each of said plurality of light source images so as to illuminate, in a superposing manner, said surface to be irradiated, said first surface coinciding with an exit surface of said light source.

27. An illumination apparatus according to claim 24, wherein said light source is an excimer laser light source and wherein said at least one deflecting member is a reflective mirror.

28. An illumination apparatus according to claim 27, wherein said shaping optical system further comprises a ray bundle magnifying system which is disposed in the optical path between said excimer laser light source and said first relay optical system and magnifies a bundle of parallel rays from said excimer laser light source.

29. An exposure apparatus comprising:

an illumination apparatus which irradiates, with illumination light, a pattern formed on a projection original; and a projection exposure optical system which projects, onto a photosensitive substrate, an image of said pattern;

said illumination apparatus comprising:

a light source which supplies a bundle of rays having a predetermined cross-sectional shape; and a shaping optical system which converts said bundle of rays entered from a predetermined first surface into a bundle of rays having a predetermined cross-section shape on a predetermined second surface;

said shaping optical system which is disposed in an optical path between the first surface and the second surface and which has a refractive power in only one of two directions which are perpendicular to an optical axis of said shaping optical system and orthogonal to each other, said shaping optical unit comprising:

a first lens group which has a refractive power in only one of said two directions which are orthogonal to each other; and a second lens group which has a refractive power only in the direction in which said first lens group has the refractive power;

wherein said shaping optical unit sets said first surface conjugate with said second surface in said two directions orthogonal to each other.

30. An exposure apparatus according to claim 29, wherein said shaping optical system further comprises a secondary image-forming optical system which is disposed in the optical path between said first surface and said shaping optical unit and converges a bundle of rays from said first surface so as to form an intermediate image and wherein said shaping optical unit re-forms an image of said intermediate image on said second surface.

31. An exposure apparatus according to claim 29, wherein said shaping optical system further comprises a secondary image-forming optical system which is disposed in the optical path between said shaping optical unit and said second surface and re-forms, on said second surface, an image of said first surface formed by said shaping optical unit.

32. An exposure apparatus according to claim 29, wherein said shaping optical system further comprises a first secondary image-forming optical system which is disposed in the optical path between said first surface and said shaping optical unit and converges a bundle of rays from said first surface so as to form an intermediate image and a second secondary image-forming optical system which is disposed in the optical path between said shaping optical unit and said second surface and re-forms, on said second surface, an image of said intermediate image formed by said shaping optical unit.

33. An exposure apparatus according to claim 29, wherein said shaping optical unit is configured as an afocal optical system which converts a bundle of parallel rays incident thereon from said first surface into a bundle of parallel rays having a predetermined cross-sectional shape and wherein each of said first and second lens groups is constituted by a cylindrical lens.

34. An exposure apparatus according to claim 29, wherein said shaping optical system, as a whole, is constituted as an afocal optical system which converts a bundle of parallel rays from said first surface into a bundle of parallel rays having a predetermined cross-sectional shape and introduces thus converted bundle of rays onto said second surface.

35. An exposure apparatus according to claim 29, wherein said shaping optical system further comprises a relay optical system which is disposed in the optical path between said first surface and said shaping optical unit and sets a third surface, which is positioned between said first surface and said shaping optical unit, conjugate with said first surface, and wherein said relay optical system comprises a first converging member which converges a bundle of rays from said first surface so as to form an intermediate image, a second converging member which converges a bundle of rays from said intermediate image and introduces thus converged bundle of rays onto said third surface, and at least one deflecting member which is disposed in at least one of the optical path between said first converging member and said intermediate image and the optical path between said intermediate image and said second converging member while being separated from said intermediate image along an optical axis of said relay optical system by a predetermined distance defined depending on change in energy density of the bundle of rays between said first and second converging members, deflects the bundle of rays from said first converging member, and introduces thus deflected bundle of rays onto said second converging member.

36. An exposure apparatus according to claim 35, wherein, based on energy density $E_0$ of light emitted from said first converging member, tolerable energy density $E_d$ which is tolerable by said at least one deflecting member during a predetermined period, and distance $D_1$ between said first converging member and said intermediate image along the optical axis, distance $D_0$ between said intermediate image and said at least one deflecting member is set so as to satisfy conditional expression:

$$D_0 > D_1 (E_0/E_d)^{1/2}.$$

37. An exposure apparatus according to claim 29, wherein said shaping optical system further comprises a relay optical system which is disposed in the optical path between said shaping optical unit and said second surface and sets a third surface, which is positioned between said shaping optical unit and said second surface, conjugate with said second surface, and wherein said relay optical system comprises a first converging member which converges a bundle of rays from said third surface so as to form an intermediate image, a second converging member which converges a bundle of rays from said intermediate image and introduces thus converged bundle of rays onto said second surface, and at least one deflecting member which is disposed in at least one of the optical path between said first converging member and said intermediate image and the optical path between said intermediate image and said second converging member while being separated from said intermediate image along an optical axis of said relay optical system by a predetermined distance defined depending on change in energy density of the bundle of rays between said first and second converging members, deflects the bundle of rays from said first converging member, and introduces thus deflected bundle of rays onto said second converging member.

38. An exposure apparatus according to claim 37, wherein, based on energy density $E_0$ of light emitted from said first converging member, tolerable energy density $E_d$ which is tolerable by at least one deflecting member during a predetermined period, and distance $D_1$ between said first converging member and said intermediate image along the optical axis, distance $D_0$ between said intermediate image and said at least one deflecting member is set so as to satisfy conditional expression:

$$D_0 > D_1 (E_0/E_d)^{1/2}.$$

39. An apparatus according to claim 29, wherein said illumination apparatus further comprises a main illumination system which guides an exit light which is emerged from said shaping optical system and passes through said second surface, to said projection original, said main illumination system comprises:

a multiple bundle rays forming optical system which divides said exit light into a plurality of bundles of rays to form multiple bundles of rays; and a condenser optical system which converges a plurality of the divided bundle of rays which are emerged from said multiple bundle rays forming optical system, to irradiate said projection original with the converged plural bundle of rays.

40. An apparatus according to claim 29, wherein each of said first and second lens groups consists of only single cylindrical lens.

41. An apparatus according to claim 30, wherein said illumination apparatus further comprises a main illumination system which guides an exit light which is emerged from said shaping optical system and passes through said second surface, to said projection original, said main illumination system comprises:

a multiple bundle rays forming optical system which divides said exit light into a plurality of bundles of rays to form multiple bundles of rays; and
  a condenser optical system which converges a plurality of the divided bundle of rays which are emerged from said multiple bundle rays forming optical system, to irradiate said projection original with the converged plural bundle of rays.

42. An apparatus according to claim 31, wherein said illumination apparatus further comprises a main illumination system which guides an exit light which is emerged from said shaping optical system and passes through said second surface, to said projection original, said main illumination system comprises:
  a multiple bundle rays forming optical system which divides said exit light into a plurality of bundles of rays to form multiple bundles of rays; and
  a condenser optical system which converges a plurality of the divided bundle of rays which are emerged from said multiple bundle rays forming optical system, to irradiate said projection original with the converged plural bundle of rays.

43. An apparatus according to claim 32, wherein said illumination apparatus further comprises a main illumination system which guides an exit light which is emerged from said shaping optical system and passes through said second surface, to said projection original, said main illumination system comprises:
  a multiple bundle rays forming optical system which divides said exit light into a plurality of bundles of rays to form multiple bundles of rays; and
  a condenser optical system which converges a plurality of the divided bundle of rays which are emerged from said multiple bundle rays forming optical system, to irradiate said projection original with the converged plural bundle of rays.

44. An exposure method comprising the steps of:
  providing an exposure apparatus according to claim 29;
  irradiating said projection original with said illumination light using said illumination apparatus; and
  transferring said pattern image of said projection original on said photosensitive substrate using said projection exposure optical system.

45. A method according to claim 44, wherein in said transferring step, said projection original and said photosensitive substrate are relatively moved with respect to said projection exposure optical system during transfer of said pattern image on said photosensitive substrate.

46. An exposure method comprising the steps of:
  providing an exposure apparatus according to claim 30;
  irradiating said projection original with said illumination light using said illumination apparatus; and
  transferring said pattern image of said projection original on said photosensitive substrate using said projection exposure optical system.

47. A method according to claim 46, wherein in said transferring step, said projection original and said photosensitive substrate are relatively moved with respect to said projection exposure optical system during transfer of said pattern image on said photosensitive substrate.

48. An exposure method comprising the steps of:
  providing an exposure apparatus according to claim 31;
  irradiating said projection original with said illumination light using said illumination apparatus; and
  transferring said pattern image of said projection original on said photosensitive substrate using said projection exposure optical system.

49. A method according to claim 48, wherein in said transferring step, said projection original and said photosensitive substrate are relatively moved with respect to said projection exposure optical system during transfer of said pattern image on said photosensitive substrate.

50. An exposure method comprising the steps of:
  providing an exposure apparatus according to claim 32;
  irradiating said projection original with said illumination light using said illumination apparatus; and
  transferring said pattern image of said projection original on said photosensitive substrate using said projection exposure optical system.

51. A method according to claim 50, wherein in said transferring step, said projection original and said photosensitive substrate are relatively moved with respect to said projection exposure optical system during transfer of said pattern image on said photosensitive substrate.

52. An exposure method comprising the steps of:
  providing an exposure apparatus according to claim 35;
  irradiating said projection original with said illumination light using said illumination apparatus; and
  transferring said pattern image of said projection original on said photosensitive substrate using said projection exposure optical system.

53. A method according to claim 52, wherein in said transferring step, said projection original and said photosensitive substrate are relatively moved with respect to said projection exposure optical system during transfer of said pattern image on said photosensitive substrate.

54. An exposure method comprising the steps of:
  providing an exposure apparatus according to claim 37;
  irradiating said projection original with said illumination light using said illumination apparatus; and
  transferring said pattern image of said projection original on said photosensitive substrate using said projection exposure optical system.

55. A method according to claim 54, wherein in said transferring step, said projection original and said photosensitive substrate are relatively moved with respect to said projection exposure optical system during transfer of said pattern image on said photosensitive substrate.

56. An exposure apparatus comprising:
  an illumination apparatus which irradiates, with illumination light, a pattern formed on a projection original; and
  a projection exposure optical system which projects, onto a photosensitive substrate, an image of said pattern;
  said illumination apparatus comprising:
  a light source unit which supplies said illumination light;
  a first converging optical system which converges said illumination light from said light source unit at a predetermined position;
  a second converging optical system which gives a converging function to light diverged from said predetermined position; and
  a deflecting member which is disposed in at least one of the optical path between said first converging optical system and the optical path between said predetermined position and said second converging optical system;
  wherein said deflecting member is arranged, while being separated from said predetermined position along an optical axis by a predetermined distance defined depending on change in energy density of the bundle of rays between said first and second converging system, and based on energy density $E_0$ of light emitted from said first converging optical system, tolerable energy density $E_d$ which is tolerable by said deflecting member during a predetermined period, distance $D_1$ between said deflecting member and said predetermined position along the optical axis, distance $D_0$ between said predetermined position and said at least one deflecting member is set so as to satisfy conditional expression:

$$D_0 > D_1 (E_0/E_d)^{1/2}.$$

57. An apparatus according to claim 56, wherein said exposure apparatus further comprises:
a multiple bundle rays forming optical system which divides a bundle of rays which passes through said second converging optical system to form multiple bundles of rays; and
a condenser optical system which converges the multiple bundles of rays from said multiple bundle rays forming optical system to irradiate said projection original with the converged plural bundles of rays.

58. An exposure method comprising the steps of:
providing an exposure apparatus according to claim 56;
irradiating said projection original with said illumination light using said illumination apparatus; and
transferring said pattern image of said projection original on said photosensitive substrate using said projection exposure optical system.

59. A method according to claim 58, wherein in said transferring step, said projection original and said photosensitive substrate are relatively moved with respect to said projection exposure optical system during transfer of said pattern image on said photosensitive substrate.

60. An exposure method comprising the steps of:
providing an exposure apparatus according to claim 57;
irradiating said projection original with said illumination light using said illumination apparatus; and
transferring said pattern image of said projection original on said photosensitive substrate using said projection exposure optical system.

61. A method according to claim 60, wherein in said transferring step, said projection original and said photosensitive substrate are relatively moved with respect to said projection exposure optical system during transfer of said pattern image on said photosensitive substrate.

* * * * *